US009112048B2

(12) United States Patent
Adekore

(10) Patent No.: US 9,112,048 B2
(45) Date of Patent: Aug. 18, 2015

(54) VERTICAL FIELD EFFECT TRANSISTOR ON OXIDE SEMICONDUCTOR SUBSTRATE

(75) Inventor: Bunmi T. Adekore, Boston, MA (US)

(73) Assignee: RAMGOSS INC., Woburn, MA (US)

( * ) Notice: Subject to any disclaimer, the term of this patent is extended or adjusted under 35 U.S.C. 154(b) by 203 days.

(21) Appl. No.: 13/588,810

(22) Filed: Aug. 17, 2012

(65) Prior Publication Data

US 2013/0043468 A1 Feb. 21, 2013

Related U.S. Application Data

(60) Provisional application No. 61/524,510, filed on Aug. 17, 2011.

(51) Int. Cl.
| | | |
|---|---|---|
| *H01L 29/78* | (2006.01) | |
| *H01L 29/808* | (2006.01) | |
| *H01L 29/267* | (2006.01) | |
| *H01L 29/66* | (2006.01) | |
| *H01L 29/778* | (2006.01) | |
| *H01L 29/08* | (2006.01) | |

(Continued)

(52) U.S. Cl.
CPC ........ *H01L 29/8083* (2013.01); *H01L 29/0847* (2013.01); *H01L 29/22* (2013.01); *H01L 29/267* (2013.01); *H01L 29/66446* (2013.01); *H01L 29/66454* (2013.01); *H01L 29/66462* (2013.01); *H01L 29/66522* (2013.01); *H01L 29/66924* (2013.01); *H01L 29/66969* (2013.01); *H01L 29/7788* (2013.01); *H01L 29/7789* (2013.01); *H01L 29/7802* (2013.01); *H01L 29/7813* (2013.01); *H01L 29/045* (2013.01); *H01L 29/0615* (2013.01); *H01L 29/0657* (2013.01); *H01L 29/1066* (2013.01); *H01L 29/2003* (2013.01)

(58) Field of Classification Search
USPC .................................................. 257/43, 623
IPC ..................................................... H01L 29/0657
See application file for complete search history.

(56) References Cited

U.S. PATENT DOCUMENTS 5,753,938 A * 5/1998 Thapar et al. ................. 257/77
5,903,020 A * 5/1999 Siergiej et al. .............. 257/264

(Continued)

FOREIGN PATENT DOCUMENTS

| DE | 102009033302 A1 | 1/2011 |
|---|---|---|
| JP | 2011061094 A | 3/2011 |

(Continued)

OTHER PUBLICATIONS

International Search Report and Written Opinion of the International Searching Authority, the European Patent Office, for International Application No. PCT/US2012/051459, 12 pages.

(Continued)

*Primary Examiner* — Eugene Lee
(74) *Attorney, Agent, or Firm* — Wilmer Cutler Pickering Hale and Dorr LLP

(57) ABSTRACT

A transistor, such as a vertical metal field effect transistor, can include a substrate including a ZnO-based material, and a structure disposed on a first side of the substrate comprising of AlGaN-based materials and electrodes disposed on the second side of the substrate. The transistor can also include a plurality of semiconductor layers and a dielectric layer disposed between the plurality of semiconductor layers and electrode materials.

27 Claims, 14 Drawing Sheets

(51) Int. Cl.
*H01L 29/22* (2006.01)
*H01L 29/04* (2006.01)
*H01L 29/06* (2006.01)
*H01L 29/10* (2006.01)
*H01L 29/20* (2006.01)

(56) References Cited

U.S. PATENT DOCUMENTS

| | | | |
|---|---|---|---|
| 6,121,633 A * | 9/2000 | Singh et al. | 257/77 |
| 6,498,362 B1 | 12/2002 | Forbes et al. | |
| 6,692,568 B2 | 2/2004 | Cuomo et al. | |
| 6,784,085 B2 | 8/2004 | Cuomo et al. | |
| 6,870,189 B1 * | 3/2005 | Harada et al. | 257/77 |
| 7,105,868 B2 | 9/2006 | Nause et al. | |
| 7,187,021 B2 * | 3/2007 | Mitra et al. | 257/264 |
| 7,348,632 B2 | 3/2008 | Kang et al. | |
| 7,482,674 B1 | 1/2009 | Freitas et al. | |
| 7,598,128 B2 | 10/2009 | Hsu et al. | |
| 7,667,266 B2 | 2/2010 | Jung et al. | |
| 7,723,154 B1 | 5/2010 | Adekore et al. | |
| 7,829,376 B1 | 11/2010 | Adekore et al. | |
| 7,863,656 B2 * | 1/2011 | Harris et al. | 257/263 |
| 7,943,995 B2 | 5/2011 | Kang et al. | |
| 8,035,128 B2 | 10/2011 | Ikeda et al. | |
| 8,039,872 B2 | 10/2011 | Otake | |
| 8,247,793 B2 * | 8/2012 | Nakahara et al. | 257/15 |
| 8,329,541 B2 | 12/2012 | Ye et al. | |
| 8,748,880 B2 * | 6/2014 | Yamazaki et al. | 257/43 |
| 8,772,829 B2 | 7/2014 | Adekore et al. | |
| 2003/0218221 A1 | 11/2003 | Wager et al. | |
| 2005/0236642 A1 | 10/2005 | Sakai et al. | |
| 2009/0206347 A1 | 8/2009 | Harris et al. | |
| 2009/0269879 A1 | 10/2009 | Adekore et al. | |
| 2010/0032008 A1 | 2/2010 | Adekore | |
| 2010/0117070 A1 | 5/2010 | Adekore et al. | |
| 2010/0133529 A1 | 6/2010 | Taraschi et al. | |
| 2010/0148224 A1 * | 6/2010 | Zhao | 257/263 |
| 2013/0040431 A1 | 2/2013 | Ye et al. | |

FOREIGN PATENT DOCUMENTS

| | | |
|---|---|---|
| JP | 2011-129775 A | 6/2011 |
| WO | WO-2008073469 A1 | 6/2008 |
| WO | WO-2009131842 A1 | 10/2009 |
| WO | WO-2009143226 A1 | 11/2009 |
| WO | WO-2009152207 A2 | 12/2009 |
| WO | WO-2010033792 A1 | 3/2010 |
| WO | WO-2010033910 A1 | 3/2010 |
| WO | WO-2010054073 | 5/2010 |
| WO | WO-2010085754 A1 | 7/2010 |

OTHER PUBLICATIONS

International Search Report and Written Opinion Issued by the International Searching Authority for International Application No. PCT/US2013/021744 mailed May 30, 2013 (12 pgs.).

* cited by examiner

VERTICAL FIELD EFFECT TRANSISTOR ON OXIDE SEMICONDUCTOR SUBSTRATE

CROSS-REFERENCE TO RELATED APPLICATIONS

This application claims the benefit under 35 U.S.C. §119 (e) of the earlier priority date of U.S. Provisional Patent Application No. 61/524,510 entitled "Vertical Metal Insulator Semiconductor Field Effect Transistor," by Bunmi Adekore, filed on Aug. 17, 2011, which is expressly hereby incorporated by reference herein in its entirety.

BACKGROUND

1. Technical Field

The disclosed subject matter relates generally to metal insulator field effect transistors and methods of making the same, and more specifically to vertical field effect transistors and metal insulator field effect transistors comprising of group-III nitride materials and/or zinc insulator based semiconductor field effect transistors.

2. Description of the Related Art

A vertical field effect transistor (VFET) is a unique class of a three terminal transistor. A VFET includes source, drain and gate electrode terminals, and the VFET sustains electric fields between the source and drain terminals vertically. A VFET is typically manufactured using silicon-based semiconductor materials. The advantage of using silicon-based materials includes a cost-efficiency and a high performance. The high performance of silicon-based VFET is attributed to a low defect interface between the silicon and a gate dielectric. The gate dielectric is a material suspended between the semiconductor layers and the gate electrode and is employed to achieve a field effect in a transistor. The insulator can include a silicon dioxide insulator and/or other "high-K" dielectric insulators, such as a hafnium insulator.

However, silicon-based VFETs have fundamental limitations. First, silicon-based VFETs cannot operate at high voltages because of the silicon's properties. The critical field of a material can be considered a strength of an electric field beyond which a material breaks down and losses its semiconductor properties. Because silicon has a relatively low energy band gap (e.g., 1.14 eV), the critical field of silicon is low. Therefore, silicon-based VFETs are not amenable to operating at high voltages. Second, the switching frequency of silicon-based VFETs is oftentimes below 100 kHz. Third, the on-resistance of silicon-based VFETs is often high, e.g., above 200 m$\Omega$-cm$^{-2}$. Lastly, the operating temperature of silicon-based VFETs can be low, e.g., around 150° C.

Some of the deficiencies of silicon-based VFETs can be addressed by silicon carbide (SiC) based VFETs. The higher band gap of SiC (e.g., 3.0 eV) enables a higher operating voltage of VFETs, up to 10,000V, higher switching frequencies, desirable lower on-resistances, and higher operating temperatures of about 230° C.

However, SiC-based VFETs are expensive to manufacture. To manufacture a power transistor that can accommodate up to 10,000V, the SiC epitaxial layer in the transistor should be substantially thick, e.g., in the range of 10 µm-100 µm. Because such a thick SiC epitaxial layer is required, the levelized cost to manufacture a SiC-based VFET can be up to 100 times more expensive compared to a silicon-based VFET. Furthermore, the on-resistance of a SiC epitaxial layer can be high, which can limit the performance of the SiC-based VFET. The high cost of manufacturing, as well as limited performance, slowed the adoption of SiC in power transistors.

SUMMARY

Certain embodiments of the disclosed subject matter include a transistor. The transistor can include a substrate and a drift layer disposed on a first side of the substrate, where the drift layer comprises a gallium nitride (GaN) based material or a zinc oxide (ZnO) based material, and where the drift layer has a thickness greater than about 3 µm. The transistor can also include a source electrode disposed above the drift layer, a gate electrode disposed above the drift layer, and a drain electrode disposed on a second side of the substrate.

In one aspect, the transistor can also include a channel layer disposed between the drift layer and the gate electrode, where the channel layer has an identical polarity as the drift layer.

In any of the embodiments described herein, the channel layer and the source electrode can form a mesa structure.

In any of the embodiments described herein, the width of the mesa structure is less than about 20 µm, forming a normally-off switch.

In any of the embodiments described herein, the width of the mesa structure is greater than about 20 µm, forming a normally-on switch.

In any of the embodiments described herein, the substrate comprises a ZnO-based material.

In any of the embodiments described herein, the transistor can also include a buffer layer disposed between the substrate and the drift layer, where the buffer layer comprises one or more of $Zn_xMg_{1-x}O$, $Zn_xCo_{1-x}O$, and $Al_xGa_{1-x}N$, $0 \le x \le 1$.

In any of the embodiments described herein, the substrate can include a material having a crystal orientation selected from the group consisting of (000±1) c-plane polar materials, (10±10) m-plane non-polar materials, (11±20) a-plane non-polar materials, and (10-1±1), (20-2±1), (10-1±2), (11-2±1), (11-2±2) semipolar materials.

In any of the embodiments described herein, the transistor can also include an interface layer disposed between the source electrode and the drift layer, wherein the interface layer has a polarity opposite to the drift layer to form a p-n junction.

In any of the embodiments described herein, the substrate comprises a metal.

In any of the embodiments described herein, the transistor can also include a bonding layer between the substrate and the drift layer, where the bonding layer is configured to bond the substrate and the drift layer.

In any of the embodiments described herein, the transistor can also include an insulating layer disposed between the gate electrode and the drift layer, where the insulating layer is configured as a trench recessed into at least a part of the drift layer.

In any of the embodiments described herein, the transistor can also include a first semiconducting layer and a second semiconducting layer disposed between the drift layer and the gate electrode, where the first semiconducting layer and the second semiconducting layer are configured to form a p-n junction.

In any of the embodiments described herein, the transistor can also include a p-well disposed in or above the drift layer, and an n-well disposed within the p-well.

Certain embodiments of the disclosed subject matter include a transistor. The transistor can include a substrate comprising a ZnO-based material, a buffer layer deposited on a first side of the substrate, and a first semiconducting layer disposed on the buffer layer, where the first semiconducting layer is deposited on the first side of the substrate using one of chemical deposition processes, and where the first semiconducting layer has a thickness greater than about 3 µm. The transistor can also include a source electrode and a gate electrode, disposed above the first semiconducting layer, and a drain electrode disposed on a second side of the substrate.

In any of the embodiments described herein, the chemical deposition processes comprise atomic layer deposition (ALD), metal-organic chemical vapor deposition, (MOCVD), hydride vapor phase epitaxy (HVPE), and liquid phase epitaxy (LPE).

In any of the embodiments described herein, the first semiconductor layer comprises $Al_xGa_{1-x}N$ and/or $Zn_xMg_{1-x}O$ materials where $0 \leq x \leq 1$.

In any of the embodiments described herein, the transistor can further include a second semiconductor layer deposited using metal-organic chemical vapor deposition (MOCVD) and/or Molecular Beam Epitaxy (MBE).

In any of the embodiments described herein, the first semiconductor layer and the second semiconductor layer form a mesa structure, where a width of the mesa structure is configured to determine a normally-on characteristic of the transistor.

In one aspect, a transistor comprises a substrate comprising a ZnO-based material, and a structure disposed on a first side of the substrate, the structure comprising a plurality of semiconductor layers and the semiconductor layers comprising of a plurality of $Al_xGa_{1-x}N$ and/or $Zn_xMg_{1-x}O$ materials.

In one aspect, a transistor comprises a substrate comprising a ZnO-based material, and a structure disposed on a first side of the substrate, the structure comprising a plurality of semiconductor layers and the semiconductor layers comprising of a plurality of $Al_xGa_{1-x}N$ and/or $Zn_xMg_{1-x}O$ materials. The device further comprises of the semiconductors layers and metal and/or conducting semiconductor material electrodes supported on the first and second side of substrate.

In one aspect, a transistor comprises a substrate comprising a ZnO-based material, and a structure disposed on a first side of the substrate, the structure comprising a plurality of semiconductor layers and the semiconductor layers comprising of a plurality of $Al_xGa_{1-x}N$ and/or $Zn_xMg_{1-x}O$ materials comprising of n-type or p-type species and wherein the n-type or p-type species may be introduced by one or a plurality of doping techniques including ion-implantation, gas-phase incorporation, solution incorporation and diffusion. The device further comprises of the semiconductors layers and metal and/or conducting semiconductor material electrodes supported on the first and second side of substrate.

In one aspect, a transistor comprises a substrate comprising a ZnO-based material, and a structure disposed on a first side of the substrate, the structure comprising a plurality of semiconductor layers and the semiconductor layers comprising of a plurality of $Al_xGa_{1-x}N$ and/or $Zn_xMg_{1-x}O$ materials. The device further comprises of at least one dielectric or insulating medium sustained on surface and/or the near-surface regions of the semiconductors layers and metal and/or conducting semiconductor material electrodes supported on the first side of substrate.

In one aspect, a transistor comprises a substrate comprising a ZnO-based material, and a structure disposed on a first side of the substrate, the structure comprising a plurality of semiconductor layers and the semiconductor layers comprising of a plurality of $Al_xGa_{1-x}N$ and/or $Zn_xMg_{1-x}O$ materials. The device further comprises of at least one dielectric or insulating medium sustained on surface and/or the near-surface regions of the semiconductors layers and metal and/or conducting semiconductor material electrodes supported on the first and second side of substrate.

In one aspect, a transistor comprises a substrate comprising a ZnO-based material, and a structure disposed on a first side of the substrate, the structure comprising a plurality of semiconductor layers and the semiconductor layers comprising of a plurality of $Al_xGa_{1-x}N$ and/or $Zn_xMg_{1-x}O$ materials. The device further comprises of at least one dielectric or insulating medium sustained on surface and/or the near-surface regions of the semiconductors layers and/or deposited into a trench recessed into the semiconductor layers and with metal and/or conducting semiconductor material electrodes supported on the first and second side of substrate.

In one aspect, a transistor comprises a substrate comprising a ZnO-based material which is n-type, and a structure disposed on a first side of the substrate, the structure comprising a plurality of semiconductor layers and the semiconductor layers comprising of a plurality of $Al_xGa_{1-x}N$ and/or $Zn_xMg_{1-x}O$ materials comprising of n-type or p-type species and wherein the n-type or p-type species may be introduced by one or a plurality of doping techniques including ion-implantation, gas-phase incorporation, solution incorporation and diffusion. The device further comprises of at least one dielectric or insulating medium sustained on surface and/or the near-surface regions of the semiconductors layers and/or deposited into a trench recessed into the semiconductor layers and with metal and/or conducting semiconductor material electrodes which may comprise of n-type or p-type species and are supported on the first and second side of substrate.

Certain embodiments of the disclosed subject matter include a method of fabricating a transistor. The method can include providing a substrate comprising a ZnO-based material, depositing a buffer layer on a first side of the substrate, and depositing a drift layer comprising $Al_xGa_{1-x}N$ and/or $Zn_xMg_{1-x}O$ materials on the buffer layer using a chemical deposition process until a thickness of the drift layer is greater than 3 µm, wherein $0 \leq x \leq 1$. The method can also include providing a source electrode and a gate electrode above the drift layer, and providing a drain electrode on a second side of the substrate.

In any of the embodiments described herein, the method further includes providing a channel layer between the drift layer and the gate electrode using metal-organic chemical vapor deposition (MOCVD) or molecular beam epitaxy (MBE).

In any of the embodiments described herein, the method further includes removing at least a portion of the channel layer to provide a mesa structure.

In any of the embodiments described herein, where removing the at least a portion of the channel layer includes etching the at least a portion of the channel layer using one or more of wet etching, inductively coupled plasma-reactive ion etching (ICP-RIE), and/or reactive ion etching (RIE).

In any of the embodiments described herein, the method further includes providing an interface layer adjacent to the channel layer through ion-implantation.

Other aspects, embodiments and features of the disclosed subject matter will become apparent from the following detailed description of the disclosed subject matter when considered in conjunction with the accompanying drawings. The accompanying figures are schematic and are not intended to be drawn to scale. In the figures, each identical, or substantially similar component that is illustrated in various figures is represented by a single numeral or notation. For purposes of clarity, not every component is labeled in every figure. Nor is every component of each embodiment of the disclosed subject matter shown where illustration is not necessary to allow those of ordinary skill in the art to understand the disclosed subject matter. All patent applications and patents incorporated herein by reference are incorporated by reference in their entirety. In case of conflict, the specification, including definitions, will control.

BRIEF DESCRIPTION OF THE DRAWINGS

Various objects, features, and advantages of the disclosed subject matter can be more fully appreciated with reference to the following detailed description of the disclosed subject matter when considered in connection with the following drawings, in which like reference numerals identify like elements.

DETAILED DESCRIPTION

Figure 1:
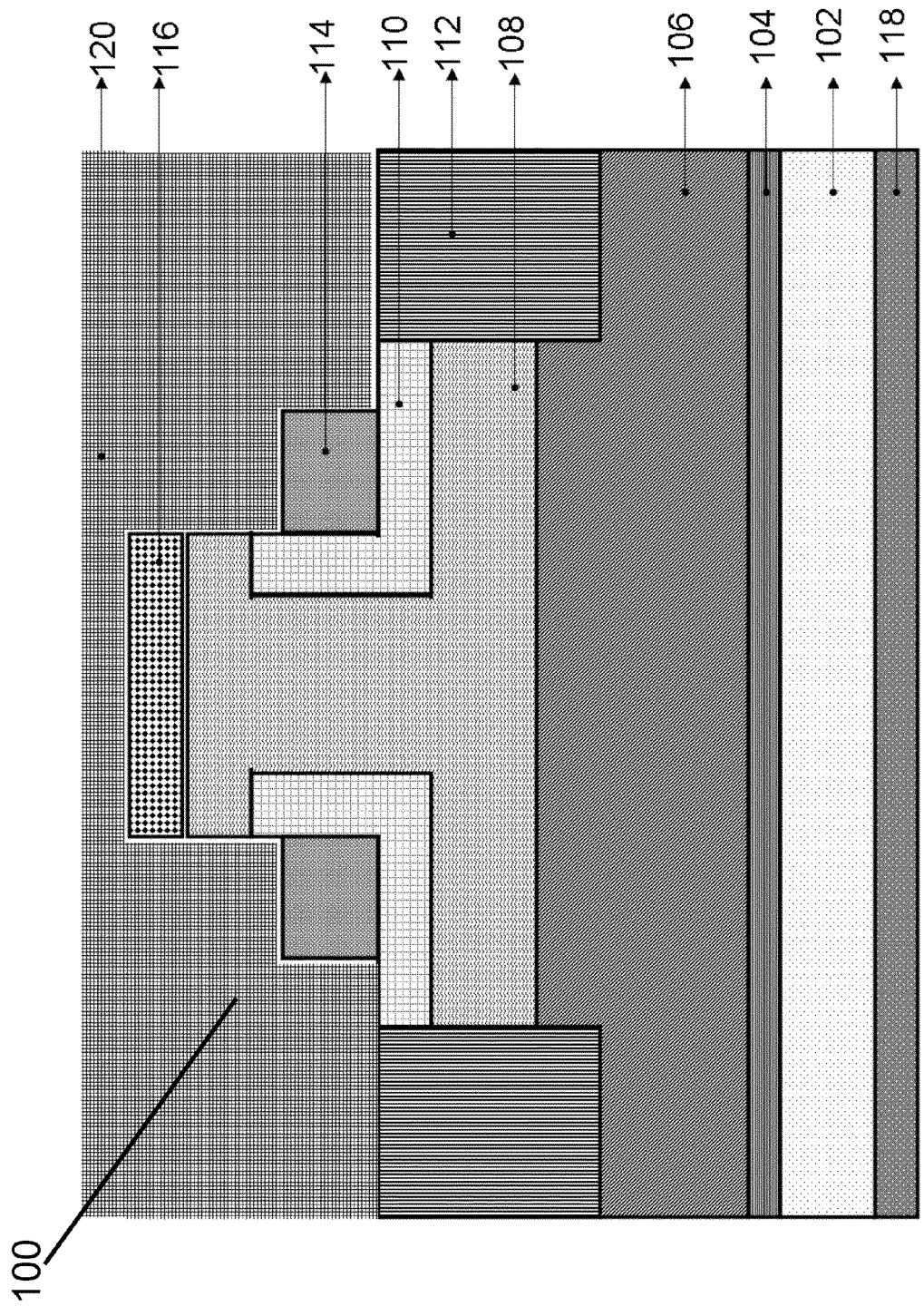
FIG. 1 is a cross-sectional view of a vertical metal semiconductor transistor in accordance with certain embodiments of the disclosed subject matter.

Reference now will be made in detail to embodiments of the disclosed subject matter. Such embodiments are provided by way of explanation of the disclosed subject matter, and the embodiments are not intended to be limiting. In fact, those of ordinary skill in the art can appreciate upon reading the specification and viewing the drawings that various modifications and variations can be made.

Before explaining at least one embodiment of the disclosed subject matter in detail, it is to be understood that the disclosed subject matter is not limited in its application to the details of construction and to arrangements of the components set forth in the following description or illustrated in the drawings. The disclosed subject matter can be manifested in other embodiments and of being practiced and carried out in various ways. Also, it is to be understood that the phraseology and terminology employed herein are for the purpose of description and should not be regarded as limiting. Numerous embodiments are described in this patent application, and are presented for illustrative purposes only. The described embodiments are not intended to be limiting in any sense. The disclosed subject matter is widely applicable to numerous embodiments, as is readily apparent from the disclosure herein. Those skilled in the art will recognize that the disclosed subject matter can be practiced with various modifications and alterations. Although particular features of the disclosed subject matter can be described with reference to one or more particular embodiments or figures, it should be understood that such features are not limited to usage in the one or more particular embodiments or figures with reference to which they are described.

As such, those skilled in the art will appreciate that the conception, upon which this disclosure is based, can readily be utilized as a basis for the designing of other structures, methods and systems for carrying out the several purposes of the disclosed subject matter. It is important, therefore, that the disclosed subject matter be regarded as including equivalent constructions to those described herein insofar as they do not depart from the spirit and scope of the disclosed subject matter.

For example, the specific sequence of the described process can be altered so that certain processes are conducted in parallel or independent, with other processes, to the extent that the processes are not dependent upon each other. Thus, the specific order of steps described herein is not to be considered implying a specific sequence of steps to perform the process. Other alterations or modifications of the above processes are also contemplated. For example, further insubstantial approximations of the process and/or algorithms are also considered within the scope of the processes described herein.

In addition, features illustrated or described as part of one embodiment can be used on other embodiments to yield a still further embodiment. Additionally, certain features can be interchanged with similar devices or features not mentioned yet which perform the same or similar functions. It is therefore intended that such modifications and variations are included within the totality of the disclosed subject matter.

One of the desirable characteristics of a power transistor is a high operating voltage. For example, it is often desirable to operate a power transistor at, up to, 5,000V. To achieve such high operating voltages, a power transistor can use a thick, silicon carbide (SiC) epitaxial layer (also known as a SiC epitaxial layer.) The high band gap voltage of SiC and the high thickness of the epitaxial layer (around 10 µm-100 µm) enable the high voltage operation of a SiC-based power transistor. However, a thick SiC epitaxial layer is often expensive to grow, therefore, the use of SiC-based power transistors have been limited.

A cost-effective alternative to SiC is a group-three nitride. For example, an aluminum gallium nitride (AlGaN) can be an attractive material for power transistors because AlGaN has a high band gap voltage. The group-three nitrides can be epitaxially grown on a SiC substrate to form a group-three nitride power transistor. To provide high operating voltages, the thickness of the group-three nitride epitaxial layer needs to be greater than 10 μm. Unfortunately, when a group-three nitride is epitaxially grown on a SiC substrate, extended line, planar and volume crystalline defects including basal plane dislocations, stacking faults and cracks can interrupt and terminally degrade the monocrystallinity of the nitride at thicknesses about 5 μm. Therefore, it is not feasible to use a group-three nitride epitaxial layer for a high voltage power transistor.

Apparatuses, systems, and methods of the disclosed subject matter address the challenges of existing high voltage power transistors. The disclosed power transistor can include a group-three nitride epitaxial layer grown on a zinc oxide (ZnO) substrate. The group-three nitride epitaxial layer can be monocrystalline (i.e., a single crystal layer.) The group-three nitride epitaxial layer can include a gallium nitride (GaN) epitaxial layer. Epitaxial layers can be grown on a ZnO substrate to a thickness ranging from about 5 μm to about 300 μm using the disclosed fabrication method.

In some devices described herein, ZnO-based materials can be employed to form part or the entire semiconductor portion of transistor, for example the semiconductor layers through which electrical charges are conducted. As used herein, a "ZnO-based material" is $A_xZn_{1-x}O$ where A includes Be, Mg, Ba, Ca, Sr, Cd, Mn, and Co and $0 \leq x \leq 1$.

FIG. 1 is a cross-sectional view of a vertical metal semiconductor field effect transistor in accordance with certain embodiments of the disclosed subject matter. The transistor 100 can include one or more of the following structures: a substrate 102, a buffer layer 104, a drift layer 106, a channel layer 108, an interface layer 110, a junction termination layer 112, a gate electrode 114, a source electrode 116, a drain electrode 118, and/or a passivation layer 120.

In some embodiments, the substrate 102 can be formed using ZnO. A ZnO-based substrate can enable the growth of low defect density monocrystalline epitaxial layers due to a low lattice mismatch between the substrate and the epitaxial layers. The low defect density monocrystalline epitaxial layers can enable efficient device performance. The low defect density monocrystalline epitaxial layers that can be formed on the ZnO substrate can include ZnO-based epitaxial layers, $Al_xGa_{1-x}N$ epitaxial layers, and $In_xGa_{1-x}N$ epitaxial layers, where $0 \leq x \leq 1$.

In some embodiments, the ZnO substrate 102 can be optically transparent and, if desired, doped so as to be electrically conductive and may vary in crystal orientation to include the following orientations (000±1) c-plane polar materials; or (10±10) m-plane non-polar materials or (11±20) a-plane non-polar materials; or (10-1±1), (20-2±1), (10-1±2), (11-2±1), (11-2±2) semipolar materials. Such a substrate can provide a low-cost and large surface area (greater than about one-inch diameter) substrates for ZnO-based, $Al_xGa_{1-x}N$ and $In_xGa_{1-x}N$ materials and can facilitate the production of cost effective and efficient power transistors.

In some embodiments, the substrate 102 can be doped n-type. The substrate 102 may comprise of n-type dopants between $10^{14}$ cm$^{-3}$ to $10^{21}$ cm$^{-3}$. The substrate 102 may possess n-type resistivity from 1Ω-cm to $10^{-6}$Ω-cm. In some embodiments, the substrate 102 can be doped p-type. For example, the substrate 102 may comprise of p-type dopants between $10^{14}$ cm$^{-3}$ to $10^{21}$ cm$^{-3}$. The substrate 102 may possess p-type resistivity from $10^3$Ω-cm to $10^{-4}$Ω-cm.

The substrate 102 can be directly coupled to the buffer layer 104. The buffer layer can facilitate the crystallization of hexagonal $Al_xGa_{1-x}N$ epitaxial layers without the formation of secondary phases. In some embodiments, the buffer layer 104 can include layers of ZnO-based materials. The ZnO-based materials for the buffer layer 104 can include $Zn_xMg_{1-x}O$ and/o $Zn_xCo_{1-x}O$, where $0 \leq x \leq 1$. In other embodiments, the buffer layer 104 can include MN and/or $Al_xGa_{1-x}N$ of composition range with $0 \leq x \leq 0.5$. In some embodiments, the buffer layer 104 can be doped n-type. For example, the buffer layer 104 may comprise of n-type dopants between $10^{14}$ cm$^{-3}$ to $10^{21}$ cm$^{-3}$. The buffer layer 104 may possess n-type resistivity from 1Ω-cm to $10^{-6}$Ω-cm. In some embodiments, the buffer layer 104 can be doped p-type. The buffer layer 104 may comprise of p-type dopants between $10^{14}$ cm$^{-3}$ to $10^{21}$ cm$^{-3}$. The buffer layer 104 may possess p-type resistivity from $10^3$Ω-cm to $10^{-4}$Ω-cm. The buffer layer 104 can be used to ease the lattice mismatch between the ZnO-based substrate 102 and GaN-based active layers. In other embodiments, the buffer layer can act as a diffusion barrier layer.

In some embodiments, the transistor 100 can include a drift layer 106. The drift layer 106 can enable a flow of carriers thereby reducing the on-resistance of the transistor 100. The drift layer 106 of a vertical transistor can also screen and/or block the applied voltage. The screened voltage and allowable current is proportional to the thickness and the area of the transistor respectively.

Oftentimes, there is a trade-off between the transistor's breakdown voltage and the transistor's on-resistance, and this trade-off can be manipulated by engineering the thickness and the doping level of the drift layer 106. If the drift layer 106 is thick and is doped with a low level of dopant concentration, then the breakdown voltage of the transistor can be high, but the on-resistance of the transistor can be high as well. On the other hand, if the drift layer 106 is thin and is doped with a high level of dopant concentration, then the on-resistance of the transistor can be low, but the breakdown voltage of the transistor can also be low. To balance the two competing characteristics, the drift layer 106 can have a thickness ranging from about 3 μm to about 300 μm and have a dopant concentration ranging from about $10^{14}$ cm$^{-3}$ to about $10^{18}$ cm$^{-3}$.

The drift layer 106 can include a ZnO-based material, for example, $Zn_xMg_{1-x}O$, where $0 \leq x \leq 1$. The drift layer 106 can also include a group-III nitride material, for example, $Al_xGa_{1-x}N$, where $0 \leq x \leq 1$. In some embodiments, the drift layer 106 can an n-type, with an n-type dopant concentration ranging from about $10^{14}$ cm$^{-3}$ to about $10^{18}$ cm$^{-3}$. In some embodiments, the drift layer 106 can a p-type with a p-type dopant concentration ranging from about $10^{14}$ cm$^{-3}$ to about $10^{18}$ cm$^{-3}$. In some embodiments, the drift layer 106 can be doped non-uniformly. In some embodiments, the drift layer 106 can be monocrystalline.

In some embodiments, the drift layer 106 can be undoped or intrinsic. In other embodiments, the drift layer 106 can be doped n-type. For example, the drift layer 106 may comprise of n-type dopants between $10^{14}$ cm$^{-3}$ to $10^{21}$ cm$^{-3}$. In some embodiments, the drift layer 106 may comprise of p-type dopants between $10^{14}$ cm$^{-3}$ to $10^{21}$ cm$^{-3}$. The drift layer 106 may possess p-type resistivity from 100 Ω-cm to $10^{-6}$Ω-cm. The drift layer 106 may possess p-type resistivity from $10^3$Ω-cm to $10^{-4}$Ω-cm.

In some embodiments, the drift layer 106 can be doped n-type or p-type with dopant concentration from about $10^{14}$ cm$^{-3}$ to about $10^{18}$ cm$^{-3}$ and can be made of low conductivity through compensation with Mg, Zn, and/or isoelectronic impurities in $Al_xGa_{1-x}N$ including, for example, Fe. The drift layer 106 can also include non-uniform doping as a function of layer thickness to facilitate engineering of the electric field screened through electrode terminals of the device.

The transistor 100 can also include a channel layer 108. The channel layer 108 can be deposited epitaxially onto the drift layer 106 and can be of thicknesses about 0.01 µm to 10 µm with a similar polarity to the drift layer 106.

In some embodiments, the drift layer 106 and the channel layer 108 can form a mesa structure. The mesa structure can be formed using etching processes. The etching processes can include the wet etching, the inductively coupled plasma-reactive ion etching (ICP-RIE), and the reactive ion etching (RIE). In some cases, the size of the mesa structure can be less than about 10 µm. In other cases, the width of the mesa structure can be greater than about 10 µm.

The transistor 100 can also include an interface layer 110. The interface layer 110 can contribute to forming a space charge region that can be depleted of charge carriers. The width of the space charge region, formed between the gate electrode and the channel layer 108, can be controlled by controlling the doping profile of the interface layer 110. For example, the width of the space charge region is inversely proportional to dopant concentration. As described below, the width of the space charge region and the mesa structure can play an important role in determining the type of the transistor. The interface layer 110 can have a thicknesses of at least 0.001 µm, and can be adjacent to the drift layer 106 and/or the channel layer 108. The interface layer 110 can have a polarity opposite to the drift layer 106 and/or the channel layer 108 to establish a p-n junction. The interface layer 110 can be formed through processes including epitaxial deposition, or by ion-implantation. In some embodiments, the interface layer 110 can be non-uniformly doped to engineer the space charge region. Grading the doping concentration in the interface layer 110 can enable an engineering of the space charge region to extend within the interface layer 110 or to be disposed completely in the channel layer 108.

The transistor 100 can also include a junction termination 112. The junction termination 112 can extend to dimensions of width and depth of at least 0.001 µm and more preferably width and depth of at least 50 µm and 1 µm respectively. The junction termination 112 can be formed by traversing wholly or in part of layers 106, 108, and 110 via ion-implantation. The ion-implantation can be performed using noble elements of group VII, elements that are iso-electronic on metals, nitrogen sublattice of AlGaN systems, metal sublattice of ZnO-based systems, or an oxygen sublattice of ZnO-based systems.

The transistor 100 can include electrodes 114, 116, 118. The electrodes can be formed using metals, including Au, Ag, Pt, Ni, Al, Si, Ti, W, Cu, p-type metallization of GaN, polysilicon, indium tin oxide, zinc gallium oxide, zinc indium oxide, and/or zinc aluminum oxide. For example, a gate electrode 114 may be deposited onto the interface layer 110; a source electrode 116 can be deposited on the mesa structures of semiconductor layers 106, 108 to form a source electrode; and a drain electrode 118 can be formed on the second side of the substrate 102.

The transistor 100 can also include a passivation layer 120. The passivation layer 120 can be deposited around the electrodes so that the electrodes can receive electrical connections. The passivation layer 120 can include an insulator, nitride, oxynitride, and/or a halogenated polymer.

In some embodiments, the width of the mesa structure and the doping profile in the mesa structure can be engineered to form a normally-on transistor, also known as a depletion mode transistor. The width of the mesa structure can affect the structure of the space charge region formed by the intrinsic built-in field, which can, in turn, affect the characteristic of the transistor 100. The intrinsic built-in field can result from doping profiles between the interface layer 110 and the channel layer 108. The intrinsic built-in field can generate a space charge region, such as a depletion region, that can be void of any charge carriers. If the mesa width is large enough as to exceed the combined width of the intrinsic space charge region formed around the interface layers 110, the intrinsic space charge region would not overlap. Therefore, the space between the intrinsic space charge regions can maintain charge carriers that can accommodate current flows. The source electrode and the drain electrode can use this space to enable current flows, even without any bias voltages applied to the gate electrodes.

The desired mesa width for the depletion mode transistor can depend on the doping concentration of the channel layer. In some embodiments, when the doping concentration in the channel layer is around $10^{14}$ cm$^{-3}$, a depletion mode transistor can have a mesa width greater than 20 µm, and preferably about 20 µm. When the doping concentration is higher, the depletion mode transistor can have a mesa width less than 20 µm. For example, the depletion mode transistor can have a mesa width of 5 µm at an appropriate doping concentration, e.g., greater than $10^{16}$ cm$^{-3}$.

The operation of the depletion mode transistor can be described as follows. If the drain to source voltage ($V_{DS}$) assumes a non-zero value, the transistor accommodates a current flow from the source electrode to the drain electrode, even without any gate voltage. Beyond a particular critical $V_{DS}$ value, $V_{DS-TH}$, the current flow in region between the source to drain, also known as the channel region, assumes a maximum value which for example can vary from about 0.001 A to about 500 A and in preferably utility from about 0.1 A to about 300 A. The application of a reverse bias voltage at the gate to source electrode ($V_{GS}$) can extend the space charge region to turn off the transistor. Conversely, the withdrawal of the reverse bias voltage $V_{GS}$ can then contract the space charge region to turn on the transistor.

In some embodiments, the width of the mesa structure can be engineered to form a normally-off transistor, also known as an enhancement mode transistor. Oftentimes, the enhancement mode transistor can have a short mesa between the gate electrodes. When the mesa is short, the space charge regions from the interface layer 110 can merge, thereby blocking the channel layer 108. Therefore, the transistor is normally-off To turn on the "normally-off" transistor, the width of the space charge regions can be reduced. In order to reduce the space charge regions, a voltage can be applied to the gate electrode. Increasing a forward bias voltage to the gate-source terminal ($V_{GS}$) can reduce the width of the space charge regions and allow a current flow from the source electrode to the drain electrode.

In some embodiments, the enhancement mode transistor can have a mesa width less than 50 µm, and preferably less than 20 µm. In some embodiments, the width of the space charge region can be modified through engineering the doping concentrations. For example, a low doping concentration of the channel layer 108, e.g., below $10^{16}$ cm$^{-3}$, can provide a wide space charge region. Therefore, if the concentration of the channel layer 108 is low, the mesa structure in an enhancement mode transistor can be wide, for example, wider than 20 µm and still achieve enhancement mode. For example, when the doping concentration in the channel layer is around $10^{14}$ cm$^{-3}$, a enhancement mode transistor can have a mesa width greater than 20 µm, and preferably about 20 µm. In contrast, a high doping concentration of the channel layer 108, e.g., above $10^{16}$ cm$^{-3}$, can provide a thin space charge region. Therefore, if the concentration of the channel layer 108 is high, the mesa structure in an enhancement mode transistor can be thin, for example, thinner than 20 µm to achieve enhancement mode. For example, the enhancement mode transistor can have a mesa width of 5 µm at an appropriate doping concentration, e.g., greater than $10^{16}$ cm$^{-3}$. In some cases, the high doping concentration in the channel layer 108 can also be desirable for reducing the transistor's on-resistance. For example, at a high doping concentration of the channel layer 108, the on-resistance of the transistor can be engineered to be below 100 mΩ-cm$^2$.

Method of Manufacture

The epitaxial layers in the transistor 100 can be formed using a method disclosed below. In certain embodiments, the buffer layer 104 includes $Al_xGa_{1-x}N$ based materials, where 0≤x≤1, and has a thickness ranging from about 0.001 µm to about 10 µm. The buffer layer 104 can be deposited directly onto the substrate 102 through a variety of techniques. The techniques can include physical deposition processes of sputtering, pulsed laser deposition (PLD), molecular beam epitaxy (MBE), or chemical deposition processes including atomic layer deposition (ALD), metal-organic chemical vapor deposition, (MOCVD), hydride vapor phase epitaxy (HVPE), liquid phase epitaxy (LPE), or any combination of these processes.

In some embodiments, it is preferable to deposit the buffer layer 104 using physical deposition processes in order to achieve hexagonal wurtzite group III Nitride crystals. The physical deposition processes can include sputtering, pulsed laser deposition (PLD) and molecular beam epitaxy (MBE). Non-uniform deposition processes, especially in reducing environments consistent with chemical deposition processes of Group III-Nitrides, can result in formation of $(Al/Ga)_2$—$ZnO_4N$ and or other intermediate compounds of the II-VI oxide and Group III Nitrides. These intermediate compounds can cause deviations from the preferred hexagonal wurtzite Group III-Nitride compound.

The drift layer 106 can form an n-type drift region in the vertical transistor 100. The drift layer 106 can include n-type dopants at a concentration of ranging from $10^{14}$ cm$^{-3}$ to $10^{17}$ cm$^{-3}$. The drift layer 106 can be formed with compounds such as $Zn_xMg_{1-x}O$ with 0≤x≤1. The growth conditions that present the intrinsic donor concentration exceeding, for example, about $10^{15}$-$10^{17}$ cm$^{-3}$ can be further modified to achieve reduced carrier concentration (<$10^{17}$ cm$^{-3}$). The reduced carrier compensation can be achieved through a compensation doping with impurities. The impurities can include group I elements including Li, K, and/or Group V impurities such as N, P, As, or Sb.

In some embodiments, the drift layer 106 can include $Al_xGa_{1-x}N$ semiconductor materials with 0≤x≤1. The drift layer 106 can vary in thickness from about 3 µm to about 300 µm and can be deposited through a variety of techniques including but not limited to physical deposition processes of sputtering, pulsed laser deposition (PLD), molecular beam epitaxy (MBE) and/or chemical deposition processes including atomic layer deposition (ALD), metal-organic chemical vapor deposition, (MOCVD), hydride vapor phase epitaxy (HVPE), liquid phase epitaxy (LPE), or a combination of these processes.

In some embodiments, the drift layer 106 can include $Al_xGa_{1-x}N$ semiconductor material, where 0≤x≤0.5. The drift layer 106 can vary in thickness from about 0.001 µm to about 50 µm, and can be deposited directly onto the buffer layer 104. In some cases, it is preferable to deposit the drift layer 106 using physical deposition processes. The physical deposition processes can include MBE, metal organic assisted molecular beam epitaxy (MOMBE). In some cases, it is preferable to deposit the drift layer 106 using ultrafast chemical deposition processes such as HVPE.

The particular advantage of the combinatory processes described thus far include the ability to combine a high growth rate (>5 µm/hr) processes such as HVPE on a barrier layer deposited on the ZnO substrate and concomitantly minimizing chemical attack to the ZnO substrate as well preventing the formation of intermediate or secondary phase compounds between the II-VI oxide and the Group III-Nitride.

The thickness of the drift layer 106 can be further augmented with the channel layer 108. The channel layer 108 can have a different doping profile of same polarity as the drift layer 106. The channel layer 108 can be deposited on the drift layer 106 through MOCVD, MBE, MOMBE, ALD, and or combination of these processes but preferably through MBE and MOMBE and more preferably through MOCVD. MOCVD offers a high throughput with well-controlled doping profiles for the channel layer 108.

The drift layer 106 and the channel layer 108 can be further engineered to contain a mesa structure through etching processes. The etching process can include wet etching and/or inductively coupled plasma-reactive ion etching (ICP-RIE), or reactive ion etching (RIE). The width of the mesa structure, formed by the drift layer 106 and/or the channel layer 108 can be between about 5 µm and 25 µm.

The interface layer 110 having a thicknesses of at least 0.001 µm is provided adjacent to the drift layer 106 and/or the channel layer 108. In some embodiments, the interface layer 110 can be provided using processes including epitaxial deposition by any of above enumerated processes or combinations thereof and preferably through metalorganic chemical vapor deposition or MBE/MOMBE or more preferably by ion-implantation of species with opposite polarity into the drift layer 106 and/or the channel layer 108 to establish a p-n junction. For example, the interface layer 100 can be formed by implanting $Zn^{2+}$ or $Mg^{2+}$ or a both at dosages of at least about $10^{10}$ cm$^{-2}$. In some cases, the implanted layers can be further subjected to rapid thermal annealing processes in activated ambient of, for example, nitrogen or argon at temperatures of about 200° C. to 1050° C. Further, the dopant concentration of the interface layer 110 can be non-uniform to facilitate engineering electric fields from the electrode terminal of the device.

Figure 2:
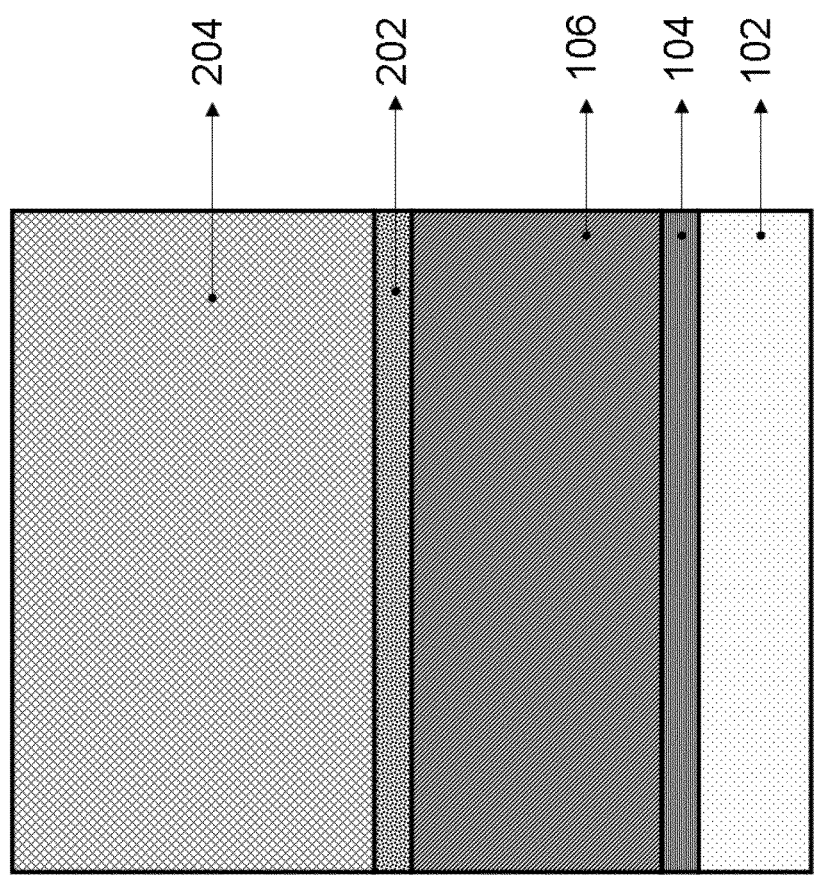
FIG. 2 illustrates an intermediate structure that can be used to prepare a metal substrate in accordance with certain embodiments of the disclosed subject matter.

In some embodiments, a transistor may be formed on a metal substrate. In some cases, a metal substrate can be prepared by (1) depositing a metal substrate on a ZnO substrate 102, a buffer layer 104, and a drift layer 106, (2) removing the ZnO substrate 102 and the buffer layer 104, and (3) flipping the structure. FIG. 2 illustrates an intermediate structure that can be used to prepare a metal substrate in accordance with certain embodiments of the disclosed subject matter. The intermediate structure 200 can include a ZnO substrate 102, a buffer layer 104, a drift layer 106, a bonding layer 202 and a metallic substrate layer 204. The bonding layer 202 can be formed using a metal or a metal alloy, and the bonding layer 202 can be bonded to the metallic substrate layer 204 including, for example, direct bonded copper through a thermal activation above 25° C.

The intermediate structure 200 can be processed to remove the ZnO substrate 102 and the buffer layer 104. The substrate 102 and the buffer layer 104 can be removed or can be reduced in thickness through one or more of the mechanical, frictional, and/or chemical processes. In some embodiments, the mechanical processes include polishing of the intermediate structure using a polishing table. The mechanical processes can also include polishing the intermediate structure using diamond, alumina, and/or silica particulate slurry. In some embodiments, the intermediate structure can be pre-processed with a chemical reagent to improve the polishing quality. The chemical reagent can include, for example, hydrogen peroxide, acetic acid, and/or phosphoric acid.

Once the ZnO substrate 102 and the buffer layer 104 are removed from the intermediate structure 200, the intermediate structure 200 can be flipped upside down, thereby placing the metal substrate 204 at the bottom of the structure and the drift layer 106 at the top of the structure. This flipped structure can be used as a metal substrate for building the rest of the transistor structure.

Figure 3:
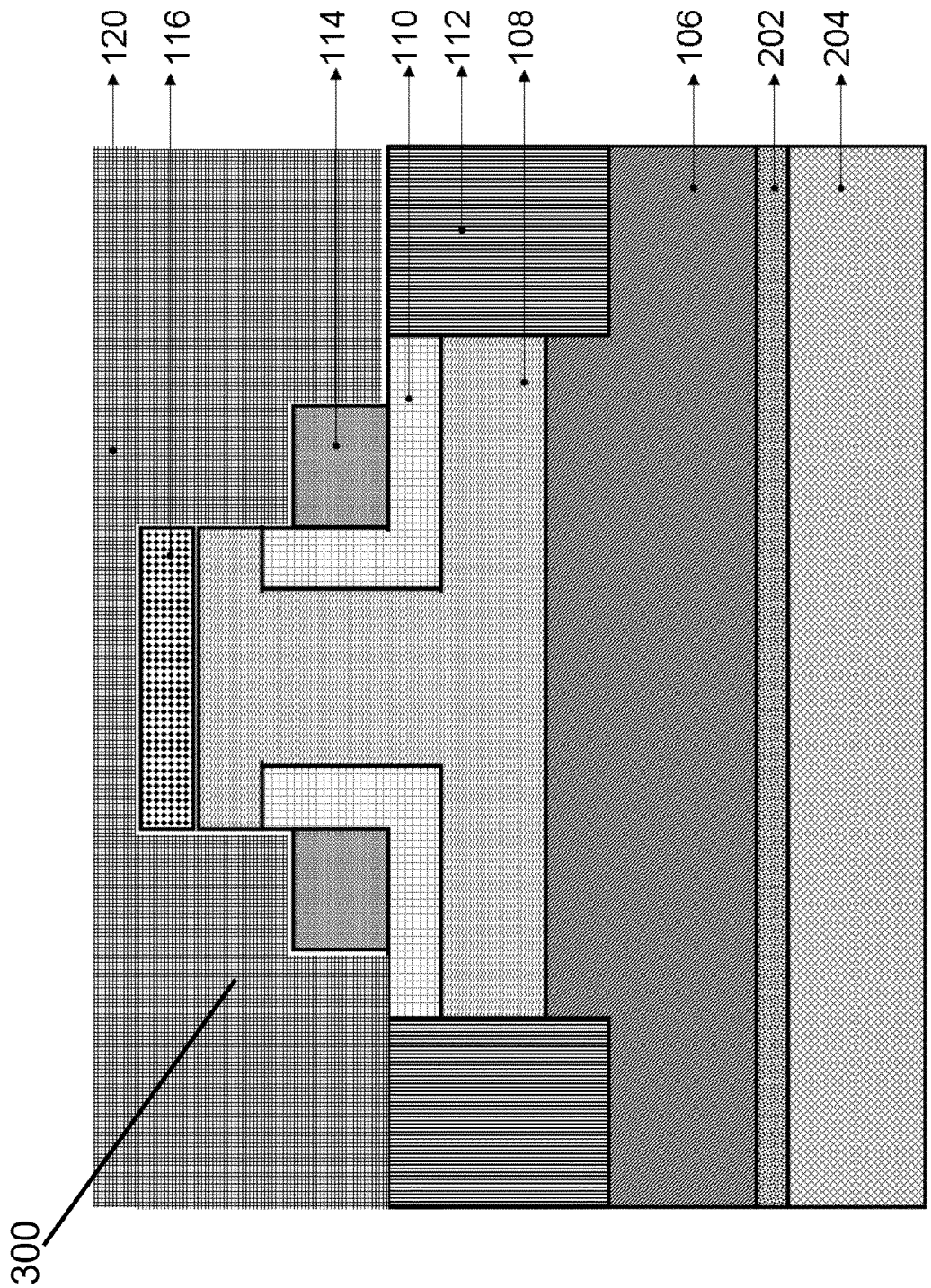
FIG. 3 illustrates a transistor provided on a metal substrate in accordance with certain embodiments of the disclosed subject matter.

FIG. 3 illustrates a transistor provided on a metal substrate in accordance with certain embodiments of the disclosed subject matter. Similarly to the transistor 100 in FIG. 1, the transistor 300 provided on a metal substrate 204 can include a channel layer 108, a interface layer 110, a junction termination layer 112, a gate electrode 114, a drain electrode 116, and a passivation layer 120. In this embodiment, the metal layer 204 can operate as a drain electrode. The characteristics of the channel layer 108, the interface layer 110, the junction termination layer 112, the electrodes 114, 116, and the passivation layer 120 can be substantially similar to those in FIG. 1.

Method of Manufacture

The transistor 300 can be fabricated using a method of manufacture disclosed below. First, the fabrication of the transistor 300 can start with the fabrication of the intermediate structure 200. The substrate 102, the buffer layer 104, and the drift layer 106 can be fabricated as illustrated with regards to the transistor 100. The bonding layer 202 can be formed by any combination of deposition processes outlined above and/or electron-beam deposition, thermal evaporation and/or electrolytic deposition on the drift layer 106. The bonding layer 202 can include a metal with melting point below 1000° C. and/or a metal alloy with an eutectic point below 1050° C. The bonding layer 202 can vary in thickness from 0.001 µm to about 1000 µm.

The bonding layer 202 can be coupled to a metallic and/or a ceramic substrate 204, such as direct bonded copper, aluminum nitride substrate, or metal plated aluminum nitride substrate. For example, the bonding layer 202 can be coated with aluminum and/or copper to form the metallic and/or the ceramic substrate 204. The resulting structure is the intermediate structure 200.

Once the intermediate structure 200 has been formed, the intermediate structure 200 can be processed to remove the ZnO substrate 102 and the buffer layer 104, thereby providing a metal substrate. The substrate 102 can be removed through mechanical or frictional processes or through chemical processes or through a combination of mechanical and chemical processes, for example, chemical mechanical polishing (CMP). The buffer layer 104 can be removed through mechanical and/or chemical processes. In some embodiments, the "un-bonded" surface of the drift layer 106 may also be processed through CMP to achieve root mean square (RMS) surface roughness below about 50 nm.

Once the metal substrate is available, semiconductor layers can be epitaxially grown on the metal substrate. The channel layer 108 of similar polarity to layer 106 may be epitaxially deposited onto the "un-bonded" surface of layer 106 and may have a thickness between 0.001 µm and 10 µm.

In some embodiments, the "un-bonded" surface of the drift layer 106 and the channel layer 108 can be further engineered to form mesa structures. These layers can be processed using etching processes including wet etching and or inductively coupled plasma-reactive ion etching (ICP-RIE), or reactive ion etching (RIE). The mesa structure width can be engineered to be about less than about 10 µm to 50 µm. The mesa structure width can be engineered to be greater than about 10 µm to 50 µm. The die area may be engineered to include mesa structures with mesa widths which are less than about 10 µm to 50 µm as well as mesa widths which are greater than about 10 µm to 50 µm.

To further grade the shape of the resultant depletion width of the established p-n junction between the drift layer 106, the channel layer 108, and the interface layer 110, the interface layer 110 can be engineered to be non-uniformly doped as a function of layer thickness.

Figure 4:
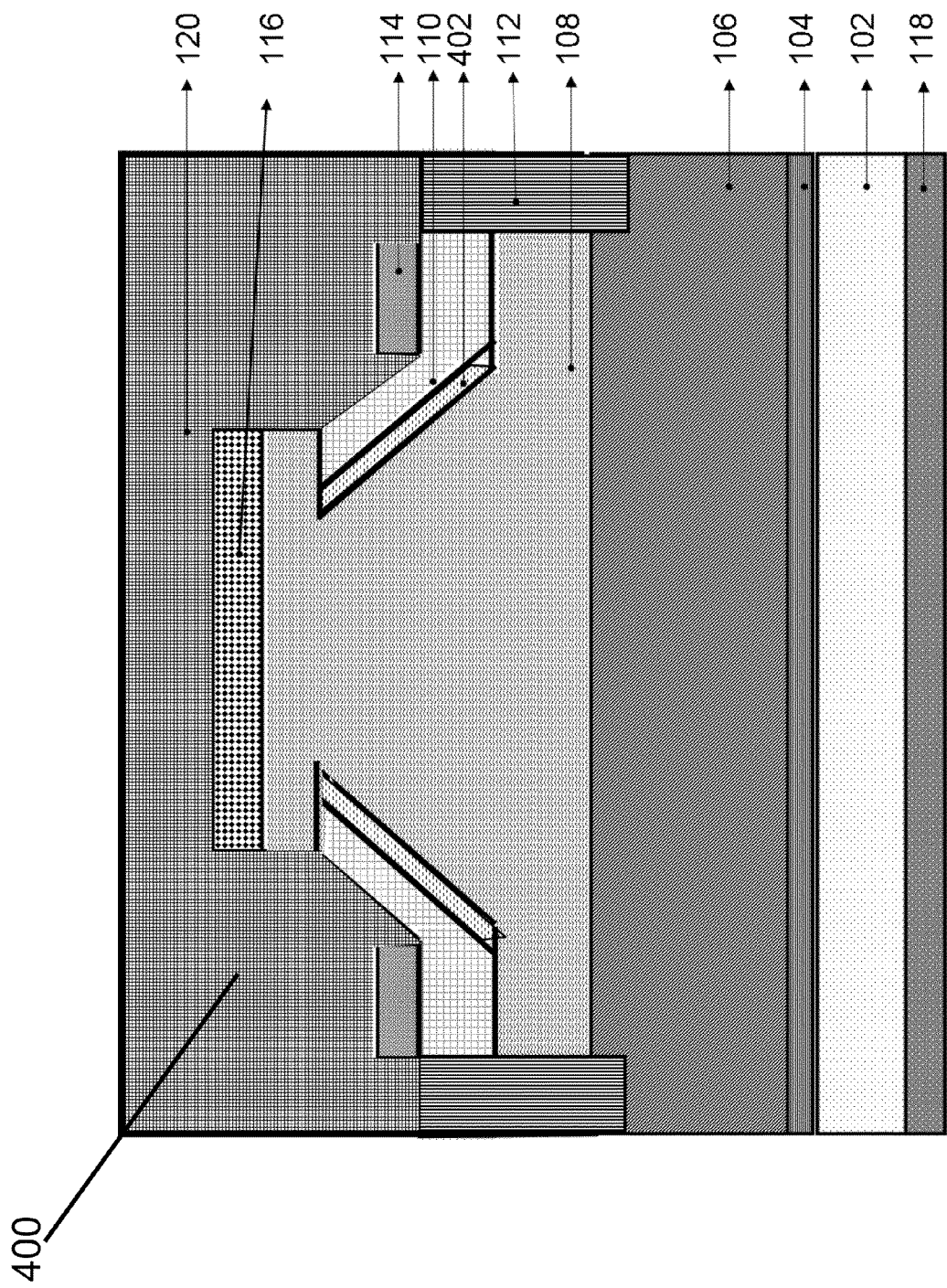
FIG. 4 illustrates a transistor having a non-vertical mesa structure in accordance with certain embodiments of the disclosed subject matter.

In some embodiments, a transistor can include a mesa structure that has a non-vertical wall. For example, the wall of a mesa structure can have an inclination less than 90° to the horizontal plane. A non-vertical mesa structure can facilitate the injection of high mobility electrons that are formed in the interface between AlGaN and GaN interfaces in the channel. FIG. 4 illustrates a transistor having a non-vertical mesa structure in accordance with certain embodiments of the disclosed subject matter. The layers in this transistor 400 can be substantially similar to the layers in the transistor illustrated in FIG. 1. In some embodiments, a channel enhancement layer 402 can be deposited on the sidewall of the mesa structure, between a channel layer 108 and an interface layer 110. The channel enhancement layer 402 can include $Al_xGa_{1-x}N$ with $0.02 \le x \le 0.5$. The channel enhancement layer 402 can form a two dimensional electron gas and thus form highly mobile carriers that can be injected into the channel region of the transistor 400.

Figure 5:
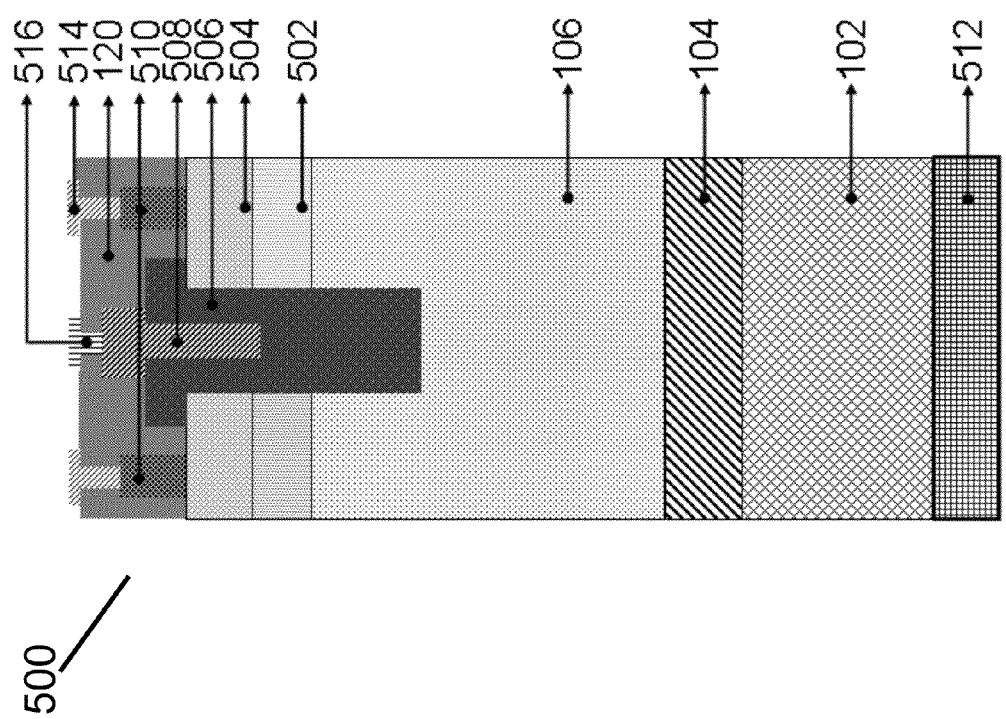
FIG. 5 is a cross-sectional view of a vertical metal insulator semiconductor field effect transistor in accordance with certain embodiments of the disclosed subject matter.

In some embodiments, the ZnO-based substrate 102 and the buffer layer 104 can be used for other types of vertical device structures. FIG. 5 is a cross-sectional view of a vertical metal insulator semiconductor field effect transistor (VMISFET) in accordance with certain embodiments of the disclosed subject matter. The transistor 500 includes a substrate 102, a buffer layer 104, a drift layer 106, bilayers 502, 504, an insulating layer 506, a gate electrode 508, a source electrode 510, a drain electrode 512, and additional electrical connections 514, 516. The transistor 500 is an insulator-based field effect transistor, which is different from a junction-based field effect transistor 100. The transistor 500 can be different from the transistor 100 in that the insulating layer 506 is utilized to create a field effect, whereas in transistor 100, the space charge region between the gate electrode and the channel layer is utilized to create a field effect.

In some embodiments, the transistor 500 can include additional layers 502, 504. These additional layers can form a bi-layer. For example, the interface between the additional layers 502, 504 can form a p-n junction. The p-n junction formed by the additional layers 502, 504 can create a body-diode and also a channel region that can enable the current flow from the source electrode to the drain electrode. In some embodiments, the layer 502 can be an n-type layer and the layer 504 can be a p-type layer. In other embodiments, the layer 502 can be a p-type layer and the layer 504 can be an n-type layer. For example, the bottom layer 502 of the bi-layer may possess n-type resistivity from $100\Omega$-cm to $10^{-6}\Omega$-cm, and the top o layer 504 of the bi-layer may possess p-type resistivity from $1000\Omega$-cm to $10^{-6}\Omega$-cm. The additional layers 502, 504 can have a thickness ranging from about 0.01 µm to about 10 µm.

The transistor 500 can also include an insulating layer 506. The insulating layer 506 can be formed using a dielectric material having a composition of $A_xB_{1-x}O_y$ and/or $A_xB_{1-x}N_y$ where A may be selected from a group including Al, Ga, La, Hf, Sc, and B may be selected from a group including Si, Zr, Zn, Ga and Sr, and where $0 \leq x \leq 1$.

In some embodiments, the insulating layer 506 can be deposited planarly on top of the underlying semiconductor layers. For example, the insulating layer 506 can be disposed between the gate electrode 508 and the planar structure having the semiconductor layers 106, 502, 504, 506. In other embodiments, the insulating layer 506 may be deposited in a recessed trench penetrating into the underlying semiconductor materials, as is illustrated in FIG. 5. In some cases, the trench can be recessed from the top most semiconductor layer through layers 502, 504 to terminate up to about half the thickness of the drift layer 106.

In some embodiments, the insulating layer 506 may extend to cover and/or passivate the up to the entire top surface of semiconductor layers, except the regions where the source electrodes 510 are in direct contact with the underlying semiconductor layers.

The transistor 500 can include a gate electrode 508. The gate electrode 508 can be formed by depositing a gate electrode material on the insulating layer 506. In some embodiments, the gate electrode material can include metals, polysilicon, indium tin insulator, zinc gallium insulator, zinc indium insulator, and/or zinc aluminum insulator.

The transistor 500 can also include a source electrode 510. The source electrode 510 can be formed by depositing a source electrode material directly on the bi-layer structure 502, 504. The source electrode material can include a metal such as Al, Si, Ti, W, Cu.

The transistor 500 can further include a drain electrode 512. The drain electrode can be formed by depositing a drain electrode material on the other side of the substrate 102. The drain electrode material can include metals, including Au, Ag, Pt, Ni, Al, Si, Ti, W, Cu, p-type metallization of GaN, polysilicon, indium tin oxide, zinc gallium oxide, zinc indium oxide, and/or zinc aluminum oxide.

In some embodiments, the source electrode 510 and the drain electrode 512 can be formed using metals or metal stacks, including Ti/Au, Ti/Al, Ti/Al/Au, Ti/Al/Pt/Au, Cr/Au, Cr/Al, Cr/Al/Au, Al/Au, Al, Al/Pt, In, Ru and/or metals or metal stacks including Cr, and/or NiO and/or Ni/Al/Au, Ni/Ti/Au, Pt/Au, Pt, Au, Ag or any combination of the foregoing to form electrical contact to the underlying semiconductor layers.

In some embodiments additional electrical connections 514, 516 are made to the gate electrode 508 and the source electrode 510 to couple the transistor 500 to other electronic parts. In some embodiments, the transistor 500 can include a passivation layer 120. As discussed previously, the passivation layer 120 can be formed using one or more of the following: an insulator, nitride, oxynitride, and a halogenated polymer.

Figure 6:
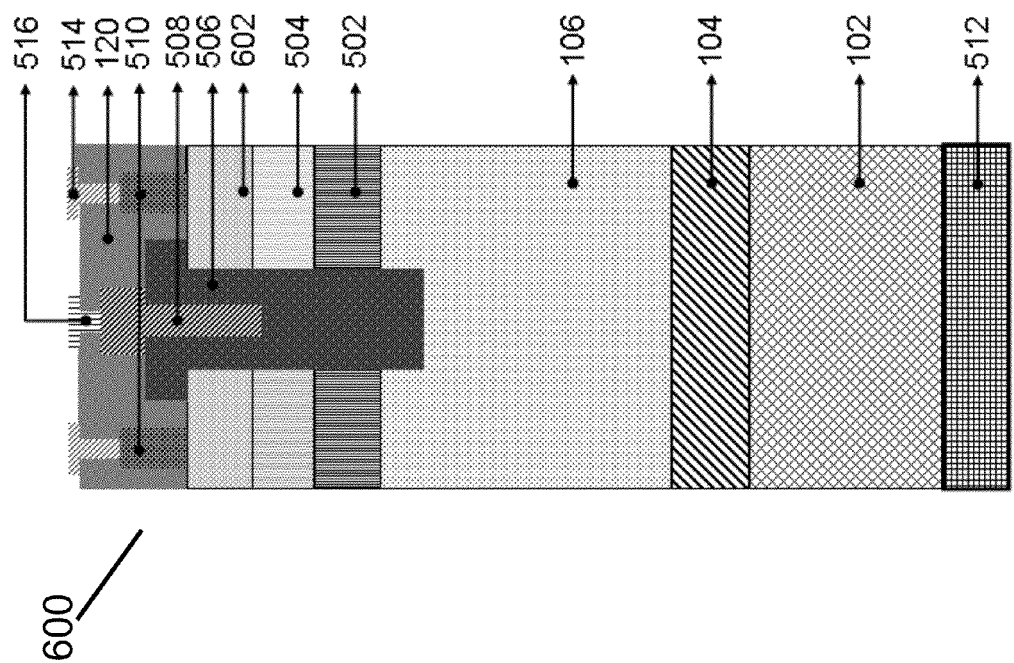
FIG. 6 illustrates a cross-sectional view of a vertical metal insulator semiconductor field effect transistor having an additional semiconductor layer in accordance with certain embodiments of the disclosed subject matter.

In some embodiments, a transistor can include an additional semiconductor layer on top of the bilayer 502, 504. FIG. 6 illustrates a cross-sectional view of a vertical metal insulator semiconductor field effect transistor having an additional semiconductor layer in accordance with certain embodiments of the disclosed subject matter. The overall structure of the transistor 600 is substantially similar to that of FIG. 5. However, the transistor 600 includes a polarization layer 602 above the bilayer 502, 504. The polarization layer 602 can impose polarization effects on the underlying layer and thus form a two dimensional electron gas. This polarization layer 602 can inject high mobility carriers into the channel to improve the current flow through the transistor 600. In some embodiments, the polarization layer 602 can include materials such as $Al_xGa_{1-x}N$ or $Mg_xZn_{1-x}O$. In some embodiments, the polarization layer 602 can be an n-type semiconductor. In other embodiments, the polarization layer 602 can be a p-type semiconductor layer. In some embodiments, the polarization layer 602 can be formed using a semiconductor material having a larger band gap, for example, $Al_xGa_{1-x}N$ or $Mg_xZn_{1-x}O$, where $0 \leq x \leq 1$.

Figure 7:
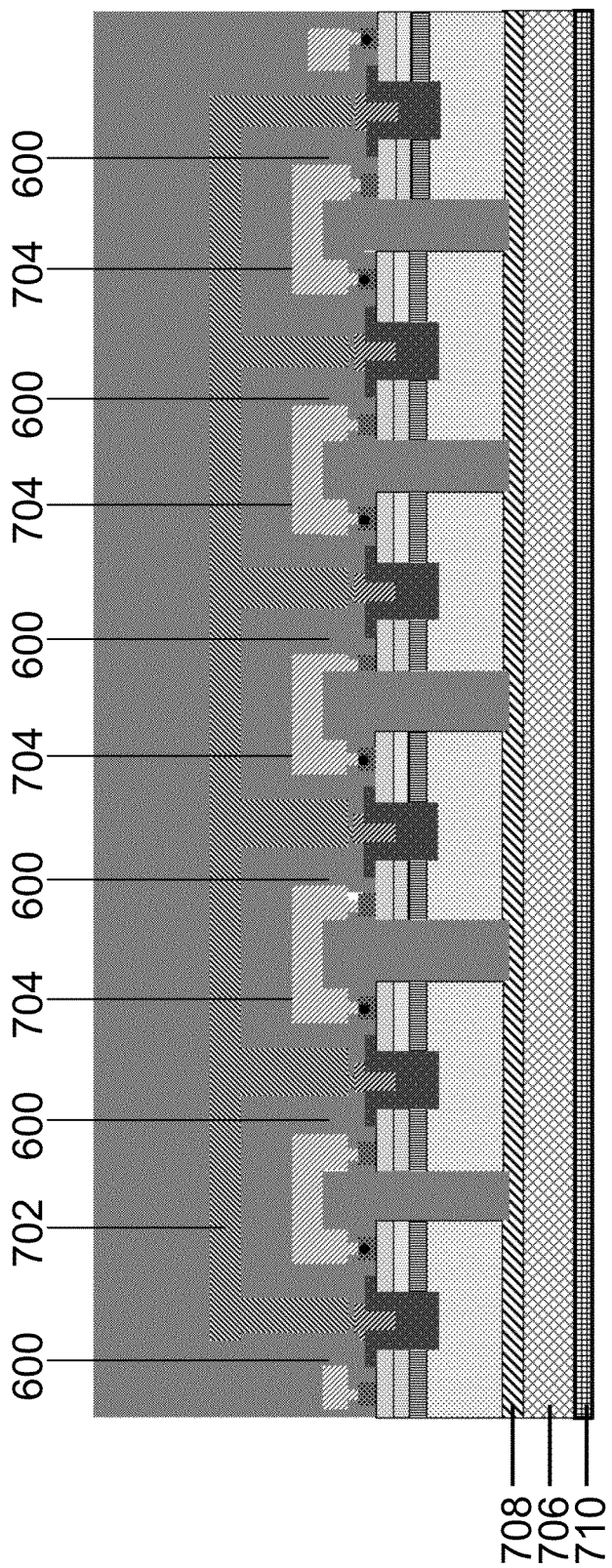
FIG. 7 illustrates how multiple transistors can share a common substrate in accordance with certain embodiments of the disclosed subject matter.

In some embodiments, multiple transistors can be coupled together on a common substrate. FIG. 7 illustrates how multiple transistors can share a common substrate in accordance with certain embodiments of the disclosed subject matter. FIG. 7 includes multiple transistors 600 whose gate electrodes are coupled together via an electrical connection 702, and whose adjacent source electrodes are coupled together via an electrical connection 704. The multiple transistors 600 are formed on a common substrate 706 and a common buffer layer 708. In the embodiment disclosed in FIG. 7, the drain electrode 710 is also shared by the transistors 600. In FIG. 7, the transistors have the structure disclosed in FIG. 6. However, other types of transistors, including transistors 100, 300, 400, 500, can also be formed on a common substrate. In some embodiment, the transistors coupled together on a common substrate may be of the same polarity. For example, the transistors can all be an n-type or a p-type.

Figure 8:
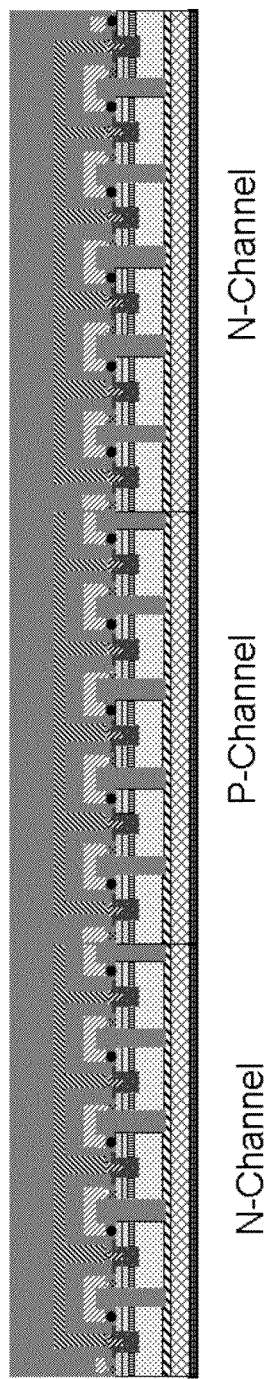
FIG. 8 illustrates a complementary transistor system in accordance with certain embodiments of the disclosed subject matter.

In some embodiment, the transistors coupled together on a common substrate may be of different polarity, forming a complementary transistor system. FIG. 8 illustrates a complementary transistor system in accordance with certain embodiments of the disclosed subject matter. In a complementary transistor system, the drain electrodes may be shared only amongst the transistors having the same polarity.

Figure 9:
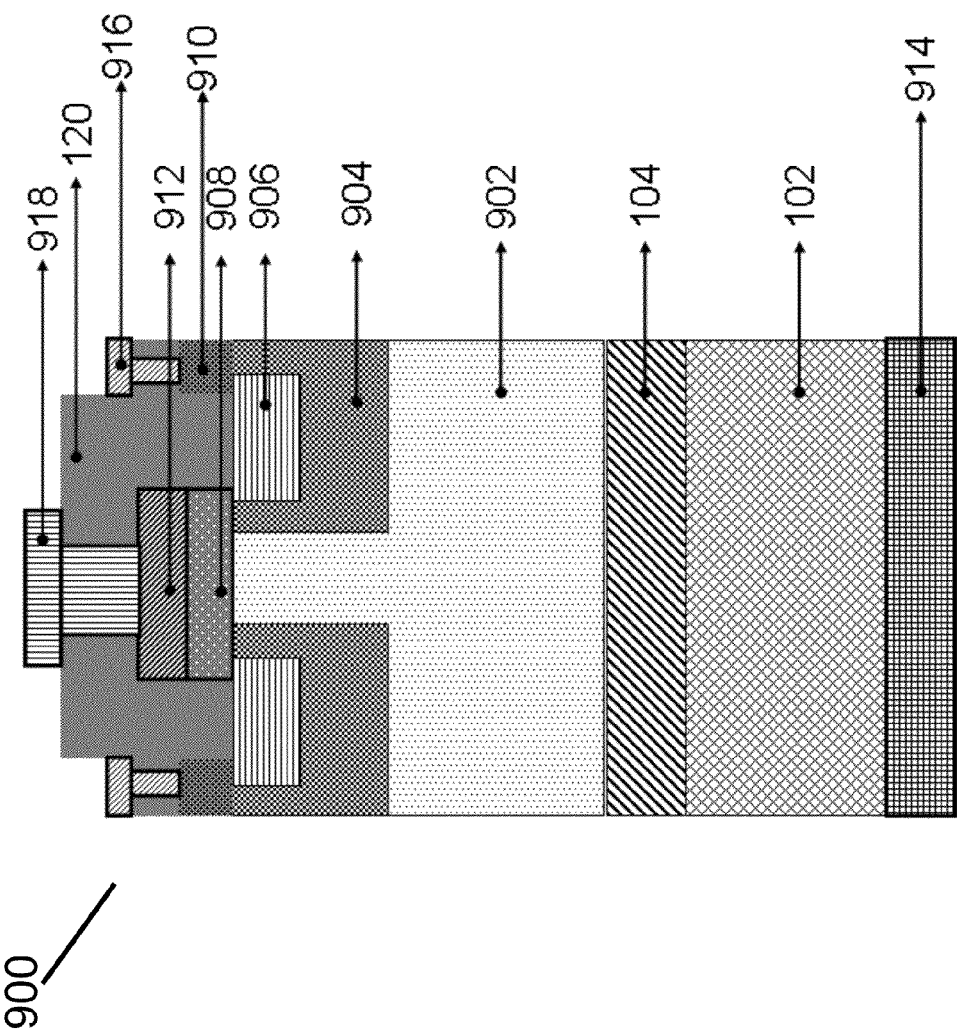
FIG. 9 illustrates a cross-sectional view of a planar vertical metal insulator semiconductor field effect transistor in accordance with certain embodiments of the disclosed subject matter.

FIG. 9 illustrates a cross-sectional view of a planar vertical metal insulator semiconductor field effect transistor (VMISFET) device in accordance with certain embodiments of the disclosed subject matter. The transistor 900 includes a substrate 102, a buffer layer 104, a drift layer 902, p-type wells 904, n-type wells 906, an insulating layer 908, a source electrode 910, a gate electrode 912, a drain electrode 914, electrical connections 916, 918 to the electrodes 910, 912, and a passivation layer 120. As in the transistor 500, the transistor 900 can provide a field effect using an insulating layer 908.

The substrate 102 and the buffer layer 104 can support a drift layer 902. The characteristics of the drift layer 902 can be substantially similar to the characteristics of the drift layer 106. For example, the drift layer 902 can be formed using a semiconductor material, such as $Zn_xMg_{1-x}O$ and/or $Al_xGa_{1-x}N$, with $0 \leq x \leq 1$. The drift layer 902 can have a thickness that can vary from about 3 μm to about 250 μm. The drift layer 902 can be undoped or intrinsic. In some embodiments, the drift layer 902 can be doped n-type. In some cases, the drift layer 902 may comprise of n-type dopants between $10^{14}$ cm$^{-3}$ to $10^{21}$ cm$^{-3}$. In other cases, the drift layer 902 may comprise of p-type dopants between $10^{14}$ cm$^{-3}$ to $10^{21}$ cm$^{-3}$. In some embodiments, the drift layer 902 may possess an n-type resistivity from 100Ω-cm to $10^{-6}$Ω-cm. In some embodiments, the drift layer 902 may possess a p-type resistivity from $10^3$Ω-cm to $10^{-4}$Ω-cm.

In some embodiments, the transistor 900 can include a p-well 904 and/or an n-well 906. The p-well 904 and the n-well 906 can provide a region of varied resistivity in the channel, which can be utilized to enhance or impede the flow of current. In some embodiments, the drift layer 902 can be implanted with p-type dopants to form adjacent a p-well 904. The dosage of the p-type dopants can be in the range of $10^{10}$ cm$^{-2}$ and $10^{16}$ cm$^{-2}$. In some embodiments, the p-well 904 may be formed by epitaxial deposition and subsequent recess-etching. In some embodiments, the window formed in the p-well 904 by recess-etching may be re-grown with n-type with a semiconductor layer of similar composition as drift layer 902. In some embodiments, the p-well 904 can also be directly implanted with n-type dopants to form an n-well 906. The dosage of the n-type dopants can be in the range of $10^{16}$ cm$^{-2}$ and $10^{16}$ cm$^{-2}$.

In some embodiments, the insulating layer 908 may be recessed to underneath or in proximity to the gate electrode 912. In some embodiments, the gate electrode 912 may comprise of metals, poly-silicon, indium tin insulator, zinc gallium insulator, zinc indium insulator, and/or zinc aluminum insulator, and may be deposited directly onto the insulating layer 908.

The transistor 900 can include a source electrode 910, which can be deposited onto the wells 904, 906. In some embodiments, the insulating layer 908 may extend to cover and/or passivate the entire top surface of semiconductor layers except the regions where source electrodes 908 are in direct contact with the underlying semiconductor layers. The transistor 900 can also include a drain electrode 914 that can be deposited on the second side of the substrate 914. In some embodiments, the transistor 900 can include a passivation layer 120, which can be deposited around the gate or source electrodes.

In some embodiments, the electrodes 910, 914 may be selected from a group metals or metal stacks including Ti/Au, Ti/Al, Ti/Al/Au, Ti/Al/Pt/Au, Cr/Au, Cr/Al, Cr/Al/Au, Al/Au, Al, Al/Pt, In, Ru and/or a group comprising of metals or metal stacks including Cr, and/or NiO and/or Ni/Al/Au, Ni/Ti/Au, Pt/Au, Pt, Au, Ag or any combination of the foregoing to form electrical contact to the underlying semiconductor layers.

Figure 10:
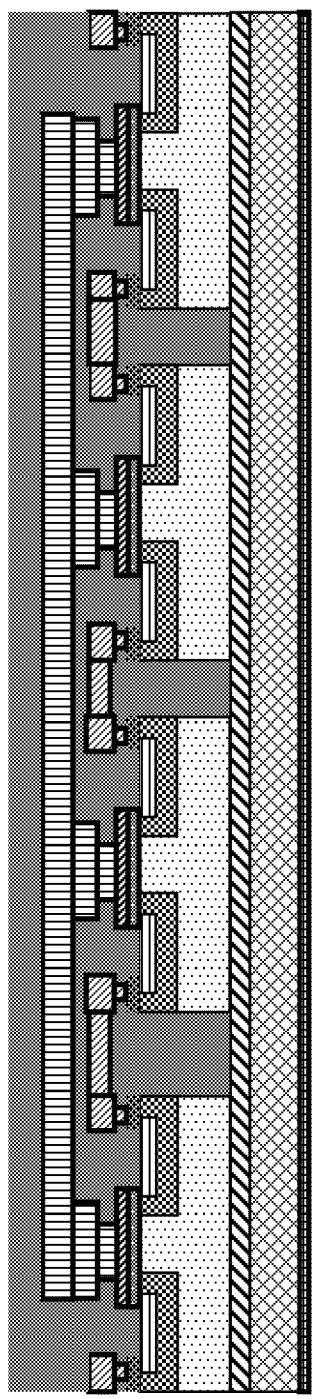
FIG. 10 illustrates a plurality of transistors having an identical polarity, fabricated on a common substrate in accordance with certain embodiments of the disclosed subject matter.
Figure 11:
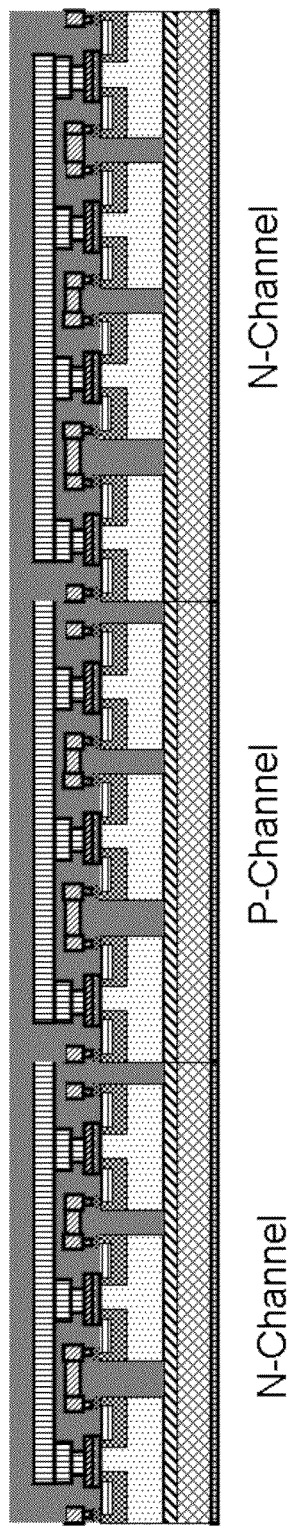
FIG. 11 illustrates a plurality of transistors having a complementary polarity, fabricated on a common substrate in accordance with certain embodiments of the disclosed subject matter.

A plurality of VMISFETs can be fabricated on a common substrate, as illustrated in FIG. 10. The plurality of VMISFETs can be of the same polarity. For example, the VMISFETs can all be an n-type device or a p-type device. In some embodiments, the VMISFETs can also share the drain electrode. In some cases, the plurality of VMISFETs can be of different polarities. For example, a plurality of n-type and p-type VMISFETs can form a complimentary circuit as shown in FIG. 11.

Figure 12:
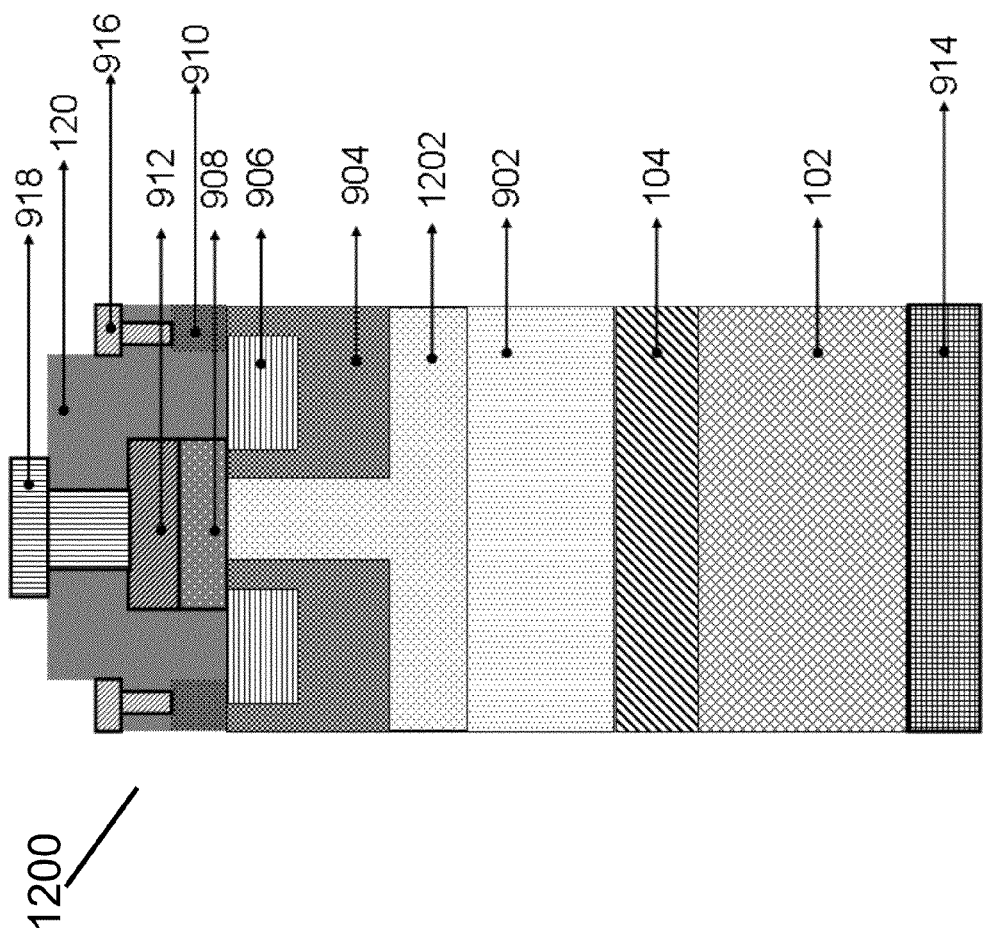
FIG. 12 illustrates a transistor with a slightly doped epitaxial layer in accordance with certain embodiments of the disclosed subject matter.

The transistor 900 can be enhanced by introducing additional layers in the transistor. FIG. 12 illustrates an improved transistor in accordance with certain embodiments of the disclosed subject matter. The transistor 1200 can include substantially similar layers as the transistor 900. The transistor 1200 can also include a slightly doped epitaxial layer 1202 disposed on top of the drift layer 902. The slightly doped epitaxial layer 1202 can be a low conductivity channel. The slightly doped epitaxial layer 1202 can be subsequently engineered using carrier-wells, such as p-wells and/or n-wells, to provide areas of increased and/or reduced conductivity as necessary. The slightly doped epitaxial layer 1202 can be doped using p-type dopants or n-type dopants, and can have a thickness of up to 50 μm.

In some embodiments, the slightly doped epitaxial layer 1202 can be doped slightly n-type and may comprise of n-type dopants between $10^{14}$ cm$^{-3}$ to $10^{18}$ cm$^{-3}$. In some embodiments, the slightly doped epitaxial layer 1202 can be doped slightly p-type and may include p-type dopants at a concentration of about $10^{14}$ cm$^{-3}$ and $10^{18}$ cm$^{-3}$.

Figure 13:
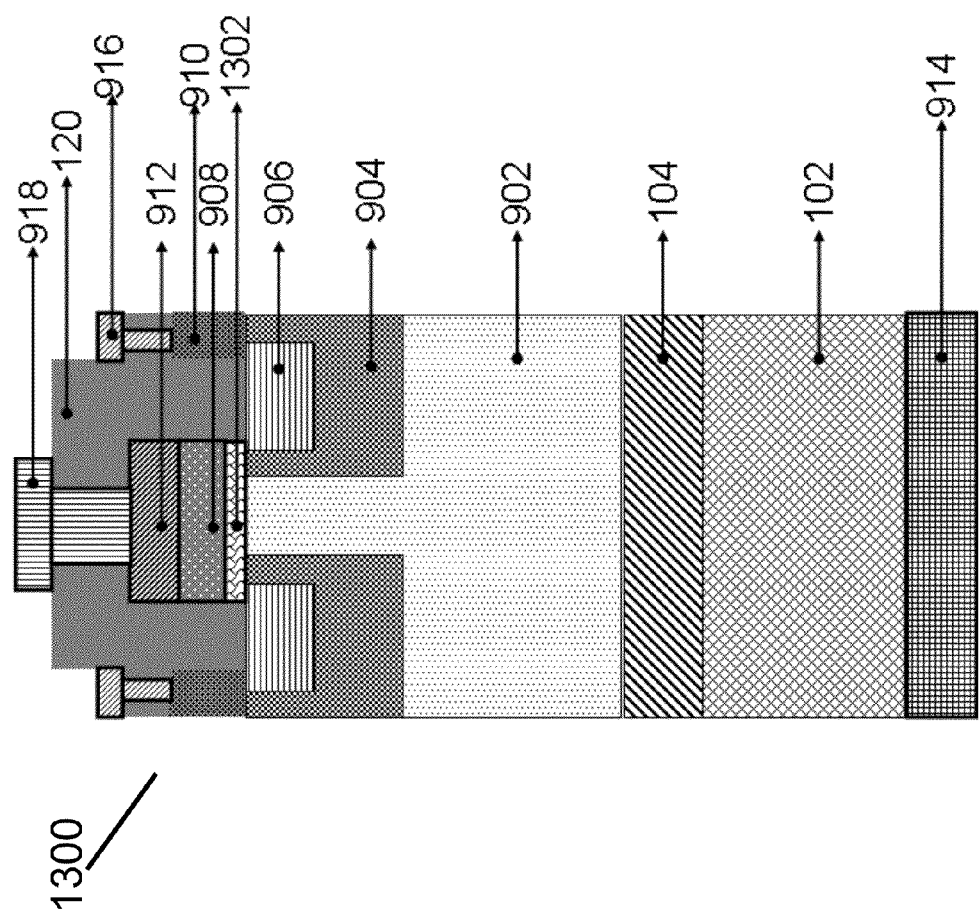
FIG. 13 illustrates a transistor with a planar semiconductor layer in accordance with certain embodiments of the disclosed subject matter.

FIG. 13 illustrates an improved transistor in accordance with certain embodiments of the disclosed subject matter. The transistor 1300 can include substantially similar layers as the transistor 900. In addition, the transistor 1300 can include a planar semiconductor layer 1302. The planar semiconductor layer 1302 can facilitate the imposition of a polarization field on the underlying semiconductor, which can assist in injecting high electron mobility carriers into the channel. The planar semiconductor layer 1302 can be formed between the insulating layer 908 and the semiconductor layers. In some embodiments, the planar semiconductor layer 1302 can include a material having a wider band gap compared to the underlying semiconductor layers. The planar semiconductor layer 1302 can be formed using materials such as $Al_xGa_{1-x}N$ or $Mg_xZn_{1-x}O$, where $0 \leq x \leq 1$. In some embodiments, planar semiconductor layer 1302 may possess n-type resistivity from $10^{-3}$ Ω-cm to $10^6$ Ω-cm.

Figure 14:
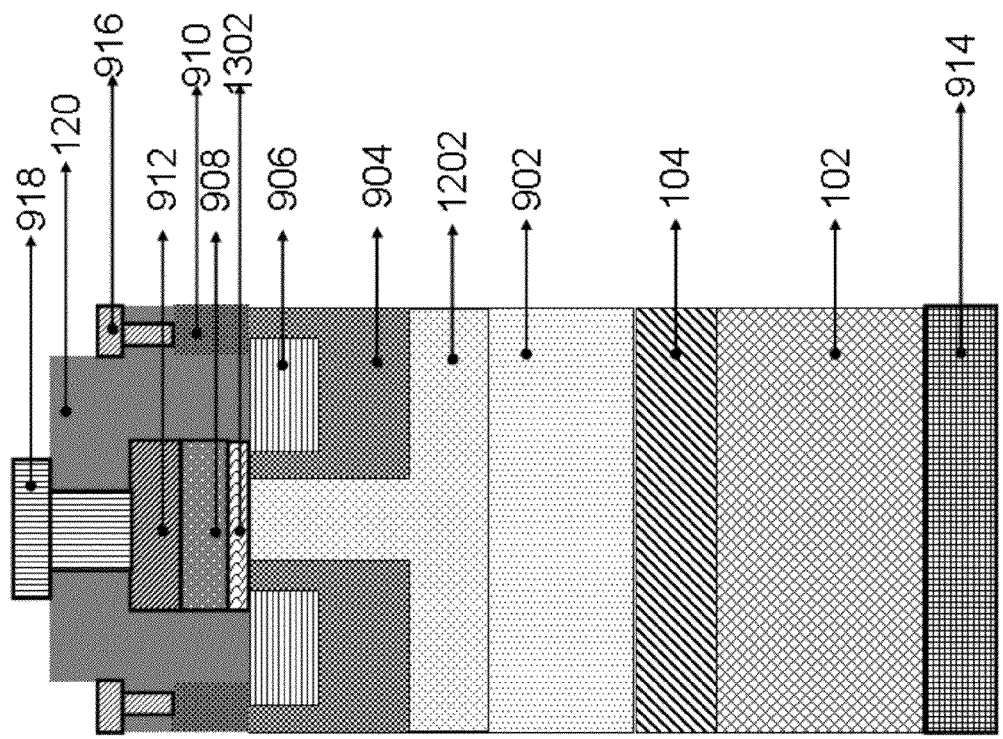
FIG. 14 illustrates a transistor with a slightly doped epitaxial layer and a planar semiconductor layer in accordance with certain embodiments of the disclosed subject matter.

In some embodiments, a transistor can include both the slightly doped epitaxial layer 1202 and the planar semiconductor layer 1302, as illustrated in FIG. 14 in accordance with certain embodiments of the disclosed subject matter.

As used herein, when a structure (e.g., layer, region) is referred to as being "on", "over" "overlying" or "supported by" another structure, it can be directly on the structure, or an intervening structure (e.g., layer, region) also can be present. A structure that is "directly on" or "in contact with" another structure means that no intervening structure is present. A structure that is "directly under" another structure means that no intervening structure is present.

The terms "an embodiment", "embodiment", "embodiments", "the embodiment", "the embodiments", "an embodiment", "some embodiments", and "one embodiment" mean "one or more (but not all) embodiments of the present disclosed subject matter(s)" unless expressly specified otherwise.

The terms "including", "having," "comprising" and variations thereof mean "including but not limited to", unless expressly specified otherwise.

The term "consisting of" and variations thereof mean "including and limited to", unless expressly specified otherwise.

The enumerated listing of items does not imply that any or all of the items are mutually exclusive. The enumerated listing of items does not imply that any or all of the items are collectively exhaustive of anything, unless expressly specified otherwise. The enumerated listing of items does not imply that the items are ordered in any manner according to the order in which they are enumerated.

The terms "a", "an" and "the" mean "one or more", unless expressly specified otherwise.

Headings of sections provided in this patent application and the title of this patent application are for convenience only, and are not to be taken as limiting the disclosure in any way.

Having thus described several aspects of at least one embodiment of this disclosed subject matter, it is to be appreciated various alterations, modifications, and improvements will readily occur to those skilled in the art. Such alterations, modifications, and improvements are intended to be part of this disclosure, and are intended to be within the spirit and scope of the disclosed subject matter. Accordingly, the foregoing description and drawings are by way of example only.

I claim:

1. A transistor comprising:
   a substrate;
   a drift layer disposed on a first side of the substrate, wherein the drift layer comprises a gallium nitride (GaN) based material or a zinc oxide (ZnO) based material, and wherein the drift layer has a thickness greater than 3 μm;
   a channel layer disposed above the drift layer, wherein a portion of the channel layer comprises a mesa structure having a sidewall;
   a channel enhancement layer coupled to the sidewall of the mesa structure, wherein the channel enhancement layer is configure to form a two dimensional electron gas for injection of highly mobile carriers into the channel layer;

an interface layer, coupled to the channel enhancement layer, forming a space charge region that is depleted of charge carriers;

a source electrode disposed above the drift layer;

a gate electrode coupled to the interface layer; and a drain electrode disposed on a second side of the substrate.

2. The transistor of claim 1, wherein the channel layer has an identical polarity as the drift layer.

3. The transistor of claim 1, wherein a width of the mesa structure is less than 20 μm, which is configured to provide a normally-off characteristic to the transistor.

4. The transistor of claim 1, wherein a width of the mesa structure is greater than 20 μm, which is configured to provide a normally-on characteristic to the transistor.

5. The transistor of claim 1, wherein the substrate comprises a ZnO-based material.

6. The transistor of claim 5, further comprising a buffer layer disposed between the substrate and the drift layer, wherein the buffer layer comprises one or more of $Zn_xMg_{1-x}O$, $Zn_xCo_{1-x}O$, and $Al_xGa_{1-x}N$, $0 \leq x \leq 1$.

7. The transistor of claim 5, wherein the substrate comprises a material having a crystal orientation selected from the group consisting of (000±1) c-plane polar materials, (10±10) m-plane non-polar materials, (11±20) a-plane non-polar materials, and (10-1±1), (20-2±1), (10-1±2), (11-2±1), (11-2±2) semipolar materials.

8. The transistor of claim 1, further comprising an interface layer disposed between the source electrode and the drift layer, wherein the interface layer has a polarity opposite to the drift layer to form a p-n junction.

9. The transistor of claim 1, wherein the substrate comprises a metal.

10. The transistor of claim 1, wherein the substrate comprises a metal-alloy having a eutectic point of about 1050° C.

11. The transistor of claim 1, further comprising an insulating layer disposed between the gate electrode and the drift layer.

12. The transistor of claim 1, further comprising an insulating layer disposed between the gate electrode and the drift layer wherein the insulating layer is configured as a trench recessed into at least a part of the drift layer.

13. The transistor of claim 1, further comprising a p-well disposed in or above the drift layer, and an n-well disposed within the p-well.

14. A transistor comprising:

a substrate comprising a ZnO-based material;

a buffer layer disposed on a first side of the substrate;

a first semiconducting layer disposed on the buffer layer, wherein the first semiconducting layer is deposited on the first side of the substrate using one or more of epitaxial deposition processes, and wherein the first semiconducting layer has a thickness greater than 3 μm;

a second semiconducting layer disposed above the first semiconducting layer, wherein a portion of the second semiconducting layer comprises a mesa structure having a sidewall;

a channel enhancement layer coupled to the sidewall of the mesa structure, wherein the channel enhancement layer is configure to form a two dimensional electron gas for injection of highly mobile carriers into the second semiconducting layer;

an interface layer, coupled to the channel enhancement layer, forming a space charge region that is depleted of charge carriers;

a source electrode and a gate electrode, disposed above the first semiconducting layer; and a drain electrode disposed on a second side of the substrate.

15. The transistor of claim 14, wherein the epitaxial deposition processes comprise atomic layer deposition (ALD), metal-organic chemical vapor deposition, (MOCVD), hydride vapor phase epitaxy (HVPE), and liquid phase epitaxy (LPE).

16. The transistor of claim 14, wherein the first semiconductor layer comprises $Al_xGa_{1-x}N$ and/or $Zn_xMg_{1-x}O$ materials, wherein $0 \leq x \leq 1$.

17. The transistor of claim 14, wherein the second semiconductor layer is deposited using metal-organic chemical vapor deposition (MOCVD) or molecular beam epitaxy (MBE).

18. The transistor of claim 14, wherein a width and doping profile of the mesa structure is configured to determine a normally-on characteristic of the transistor.

19. The transistor of claim 14, further comprising an interface layer adjacent to the second semiconductor layer, wherein the interface layer is ion-implanted.

20. The transistor of claim 14, wherein the buffer layer comprises one or more of $Zn_xMg_{1-x}O$, $Zn_xCo_{1-x}O$, and $Al_xGa_{1-x}N$, $0 \leq x \leq 1$.

21. A transistor comprising:

a substrate comprising a metal;

a drift layer disposed on a first side of the substrate, wherein the drift layer comprises a gallium nitride (GaN) based material or a zinc oxide (ZnO) based material, and wherein the drift layer has a thickness greater than 3 μm;

a channel layer disposed above the drift layer, wherein a portion of the channel layer comprises a mesa structure having a sidewall;

a channel enhancement layer coupled to the sidewall of the mesa structure, wherein the channel enhancement layer is configure to form a two dimensional electron gas for injection of highly mobile carriers into the channel layer;

an interface layer, coupled to the channel enhancement layer, forming a space charge region that is depleted of charge carriers;

a source electrode disposed above the drift layer;

a gate electrode disposed above the drift layer; and wherein the substrate is configured to operate as a drain electrode of the transistor.

22. The transistor of claim 21, further comprising a bonding layer between the substrate and the drift layer, wherein the bonding layer is configured to bond the metal and the drift layer.

23. The transistor of claim 1, wherein the channel layer comprises a p-type dopant.

24. The transistor of claim 1, wherein the interface layer is ion-implanted.

25. The transistor of claim 21, wherein the interface layer is ion-implanted.

26. The transistor of claim 1, wherein the channel enhancement layer comprises $Al_xGa_{1-x}N$, wherein x is between 0 and 1.

27. The transistor of claim 1, wherein the channel enhancement layer comprises $Al_xGa_{1-x}N$, wherein x is between 0.02 and 0.5.

* * * * *